United States Patent
Pellon et al.

(10) Patent No.: US 7,408,750 B2
(45) Date of Patent: Aug. 5, 2008

(54) METHODS OF DETECTING ARC FAULTS CHARACTERIZED BY CONSECUTIVE PERIODS OF ARCING

(75) Inventors: Christian V. Pellon, Norton, MA (US); Michael J. Lavado, Griswold, CT (US); Jeffrey B. Ting, New York, NY (US)

(73) Assignee: Sensata Technologies Massachusetts, Inc., Attleboro, MA (US)

( * ) Notice: Subject to any disclaimer, the term of this patent is extended or adjusted under 35 U.S.C. 154(b) by 335 days.

(21) Appl. No.: 11/391,954

(22) Filed: Mar. 29, 2006

(65) Prior Publication Data

US 2006/0181816 A1    Aug. 17, 2006

Related U.S. Application Data

(63) Continuation-in-part of application No. 10/937,487, filed on Sep. 9, 2004, now Pat. No. 7,190,562.

(51) Int. Cl.
    *H02H 3/00* (2006.01)
(52) U.S. Cl. ............................. 361/42; 361/93.1; 361/94
(58) Field of Classification Search .................. 361/42, 361/93.1, 94
    See application file for complete search history.

(56) References Cited

U.S. PATENT DOCUMENTS

| | | | | |
|---|---|---|---|---|
| 5,818,671 A * | 10/1998 | Seymour et al. | ................ | 361/42 |
| 5,835,321 A * | 11/1998 | Elms et al. | ...................... | 361/45 |
| 5,933,305 A * | 8/1999 | Schmalz et al. | ................ | 361/42 |
| 6,195,241 B1 * | 2/2001 | Brooks et al. | ................. | 361/42 |
| 6,577,484 B1 * | 6/2003 | Macbeth et al. | ................ | 361/92 |
| 6,590,754 B1 * | 7/2003 | Macbeth | ....................... | 361/42 |
| 6,639,768 B2 * | 10/2003 | Zuercher et al. | .............. | 361/42 |
| 6,980,407 B2 | 12/2005 | Kawate et al. | | |
| 2006/0274460 A1 * | 12/2006 | Zuercher et al. | .............. | 361/42 |
| 2006/0279883 A1 * | 12/2006 | Elms et al. | ...................... | 361/42 |
| 2007/0153436 A1 * | 7/2007 | Pellon et al. | ................... | 361/42 |

OTHER PUBLICATIONS

U.S. Appl. No 10/937,487, filed Sep. 9, 2004 entitled Method for Detecting Arc Faults Inventors: Christian V. Pellon, Mark D. Rabiner, Michael Parker, Christopher A. Nicolls, Keith W. Kawate, Robert Zanelli, Roger D. Mayer, Lucien Fontaine, Michael J. Lavado, Lynwald Edmunds, Jeffrey B. Ting.

* cited by examiner

*Primary Examiner*—Michael J Sherry
*Assistant Examiner*—Christopher J Clark
(74) *Attorney, Agent, or Firm*—Russell E. Baumann

(57) ABSTRACT

An apparatus and method for detecting electrical arc faults that has reduced susceptibility to nuisance tripping. The apparatus includes a current sensor, an input sense circuit, an arcing sense circuit, a power supply, a tripping circuit, a processing unit, and an electromechanical interface. The processing unit measures multiple voltage levels provided by the arcing sense circuit during a specified number of consecutive time periods. Next, the processing unit determines the number of consecutive time periods during which the voltage levels exceeded a specified minimum value, take on successively lower or higher values, or fall outside a predetermined normal range of values. Based upon the results of this determination, the processing unit either trips the electromechanical interface to interrupt power to a load, or inhibits tripping of the electromechanical interface, thereby reducing the occurrence of nuisance tripping.

34 Claims, 13 Drawing Sheets

305

| | Oldest Data | | | Newest Data | Pulse Counter Active? |
|---|---|---|---|---|---|
| 0x0 | 0 | 0 | 0 | 0 | Y |
| 0x1 | 0 | 0 | 0 | k | N |
| 0x2 | 0 | 0 | k | 0 | N |
| 0x3 | 0 | 0 | k | k | Y |
| 0x4 | 0 | k | 0 | 0 | N |
| 0x5 | 0 | k | 0 | k | Y |
| 0x6 | 0 | k | k | 0 | N |
| 0x7 | 0 | k | k | k | Y |
| 0x8 | k | 0 | 0 | 0 | Y |
| 0x9 | k | 0 | 0 | k | N |
| 0xA | k | 0 | k | 0 | Y |
| 0xB | k | 0 | k | k | N |
| 0xC | k | k | 0 | 0 | Y |
| 0xD | k | k | 0 | k | N |
| 0xE | k | k | k | 0 | Y |
| 0xF | k | k | k | k | Y |

ANY OTHER COMBINATIONS: PULSE COUNTER = N
e.g. [0 0 j k]

Legend:
    0 = Zero Pulses during AC half-cycle
    k = a "k" number of pulses during AC half-cycle
    j = a "j" number of pulses different from "k" in AC half-cycle
    Y = Pulse Counter Active
    N = Pulse Counter Inactive

*Fig. 5*

METHODS OF DETECTING ARC FAULTS CHARACTERIZED BY CONSECUTIVE PERIODS OF ARCING

CROSS REFERENCE TO RELATED APPLICATIONS

This application is a continuation-in-part application of prior U.S. patent application Ser. No. 10/937,487 filed Sep. 9, 2004 now U.S. Pat. No. 7,190,562 entitled METHOD FOR DETECTING ARC FAULTS.

STATEMENT REGARDING FEDERALLY SPONSORED RESEARCH OR DEVELOPMENT

N/A

BACKGROUND OF THE INVENTION

The present invention relates generally to apparatus and methods for detecting arc faults, and more specifically to arc fault detection apparatus and methods that are less susceptible to nuisance tripping.

Arc fault detection apparatus and methods are known that employ a micro-controller to measure voltages associated with a load, and to process data representing the voltage measurements to determine the presence of electrical arcing. For example, a conventional arc fault detection apparatus may be configured to sense an alternating load current, to filter and rectify the AC signal, and to provide the rectified signal to an integrating capacitor. The conventional arc fault detection apparatus may then use a micro-controller to take measurements of the voltage across the integrating capacitor, and to convert the voltage measurements to digital data for subsequent processing using an algorithm. For example, such an algorithm may be employed to analyze the measured voltage levels corresponding to respective cycles of the line voltage, and to determine whether the voltage measurements are characteristic of an electrical arc fault such as point contact, low level, or series electrical arcing, or a nuisance load such as a dimmer control, a motor, incandescent lighting, appliance thermostat switching, drill current transitions, random line voltage spikes, EMI bursts, etc. In the event the voltage measurements are characteristic of an arc fault, the conventional arc fault detection apparatus typically trips a circuit breaker to disconnect the power output from the load.

Although the above-described conventional arc fault detection apparatus can be employed to detect and distinguish between electrical arc faults and nuisance loads, there is a need for arc fault detection techniques that have increased reliability. For example, electrical arcing indicative of an arc fault is generally chaotic in nature. In contrast, nuisance loads such as triac-controlled dimmer circuits can produce electrical arcing events that are periodic. However, conventional arc fault detection apparatus often cannot reliably distinguish between periodic and non-periodic electrical arcing events, and are therefore prone to nuisance tripping. Further, nuisance loads such as dimmer controls, motors, and incandescent lighting can generate high voltage transients as the settings of these devices are changed, thereby producing decreasing or increasing levels of electrical arcing over consecutive time periods. However, conventional arc fault detection apparatus frequently have difficulty distinguishing between electrical arc faults and electrical arcing events characterized by a transient decrease or increase in voltage levels, which are generally indicative of a nuisance load. In addition, although some loads may produce noisy switching signals having abnormally high voltage levels, such high voltage levels are not necessarily indicative of electrical arcing and may be incorrectly characterized as arc faults by conventional arc fault detection apparatus.

It would therefore be desirable to have improved arc fault detection apparatus and methods that avoid the drawbacks of the above-described conventional arc fault detection apparatus and methods.

BRIEF SUMMARY OF THE INVENTION

In accordance with the present invention, an apparatus and method for detecting electrical arc faults is provided that has reduced susceptibility to nuisance tripping. In one embodiment, the arc fault detection apparatus includes a current sensor, an input sense circuit, an arcing sense circuit, a power supply, a tripping (firing) circuit, a processing unit, and an electromechanical interface. In one mode of operation, the current sensor monitors a power input comprising an alternating current (AC), and provides high frequency components of the AC current to the input sense circuit. Next, the input sense circuit filters and rectifies the AC signal at its input, and provides the rectified signal to the arcing sense circuit. The arcing sense circuit then provides a plurality of voltage levels to the processing unit. The processing unit is operative to measure each voltage level, to store information relating to the measured voltage levels, and to process the stored information using one or more algorithms, thereby determining whether the high frequency components of the AC current resulted from an electrical arc fault or a nuisance load. In the event the high frequency AC current components resulted from an arc fault, the processing unit activates the firing circuit to trip the electromechanical interface, thereby interrupting the power output to the load.

In the presently disclosed embodiment, the processing unit executes multiple algorithms for detecting and distinguishing between electrical arc faults and nuisance conditions. According to a first algorithm, the processing unit measures multiple voltage levels provided by the arcing sense circuit during a specified number of consecutive time periods. In one embodiment, the processing unit performs a single voltage level measurement during each of the consecutive time periods. In another embodiment, the processing unit performs a plurality of voltage level measurements during each time period. For example, each of the consecutive time periods may correspond to a half cycle of the line voltage. Alternatively, each time period may correspond to a predetermined constant or variable time period. Next, the processing unit determines the number of consecutive time periods during which the voltage levels provided by the arcing sense circuit exceeded a specified minimum value. In the event the number of consecutive time periods for which the measured voltage levels exceeded the specified minimum value is greater than or equal to a predetermined threshold, the processing unit activates the firing circuit to trip the electromechanical interface, which interrupts the power output to the load. In this case, the high frequency components of the AC line current are deemed to have resulted from an electrical arc fault. In the event the number of consecutive time periods for which the measured voltage levels exceeded the specified minimum value is less than the predetermined threshold, tripping of the electromechanical interface is inhibited. In this case, the high frequency components of the AC line current are deemed to have resulted from a nuisance load.

According to a second algorithm, the processing unit measures multiple voltage levels provided by the arcing sense circuit during a specified number of consecutive time periods, and determines the number of consecutive time periods during which the voltage levels provided by the arcing sense circuit take on successively lower values. According to a third algorithm, the processing unit again measures multiple voltage levels provided by the arcing sense circuit during a specified number of consecutive time periods. However, when performing the third algorithm, the processing unit determines the number of consecutive time periods during which the voltage levels provided by the arcing sense circuit take on successively higher values. In the event the number of consecutive time periods for which the measured voltage levels take on successively lower or higher values is greater than or equal to a predetermined threshold, tripping of the electromechanical interface is inhibited. In each case, the high frequency components of the AC line current are deemed to have resulted from a nuisance load. These second and third algorithms can be used in conjunction with the first algorithm described above to reduce the occurrence of nuisance tripping.

According to a fourth algorithm, the processing unit measures multiple voltage levels provided by the arcing sense circuit during a specified number of consecutive time periods, and determines whether one or more of the measured voltage levels fall outside a predetermined range of values. In the event the processing unit determines that one or more of the measured voltage levels fall outside the predetermined range, thereby indicating that one or more of the measured voltage levels are abnormally high, tripping of the electromechanical interface is inhibited. In this case, the high frequency components of the AC line current are deemed to have resulted from, for example, high level or parallel arcing, line noise, a circuit malfunction, or a nuisance load. Such abnormally high voltages can typically be controlled via a diode-corrected capacitor or bridge or any other suitable output limiting, bounding, or clipping circuit, or any suitable range checking technique. Like the second and third algorithms described above, this fourth algorithm can be used in conjunction with the first algorithm to reduce the occurrence of nuisance tripping. For example, the specified minimum value employed in the first algorithm may be selected to fall within the predetermined range of values employed in the fourth algorithm.

By measuring multiple voltage levels provided by the arcing sense circuit during a specified number of consecutive time periods, and analyzing the measured voltage levels based upon criteria such as the number of consecutive periods for which the measured levels exceed a specified minimum value, the number of consecutive periods for which the measured levels take on successively lower or higher values, and whether or not any of the measured levels fall outside a predetermined range of values, electrical arc faults can be detected with increased reliability and the occurrence of nuisance tripping can be reduced.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which:

FIG. 1b is a schematic diagram illustrating the arc fault detection apparatus of FIG. 1a;

FIG. 2 is a flow diagram illustrating a three cycle algorithm performed by the arc fault detection apparatus of FIG. 1a;

FIG. 3 is a schematic diagram illustrating a comparator circuit that may be employed in the arc fault detection apparatus of FIG. 1a;

FIGS. 4a-4b are flow diagrams illustrating pulse counter algorithms performed by the arc fault detection apparatus of FIG. 1a;

FIG. 5 is a table illustrating the mapping of measurement data sets employed by the pulse counter algorithms of FIGS. 4a-4b;

FIG. 6 is a flow diagram illustrating an arcing event counter algorithm performed by the arc fault detection apparatus of FIG. 1a;

FIG. 7 is a flow diagram illustrating a method of integrating the output of a comparator circuit using a digital counter performed by the arc fault detection apparatus of FIG. 1a;

FIG. 8 is a flow diagram illustrating a method of operation including the three cycle algorithm of FIG. 2, the pulse counter algorithm of FIGS. 4a-4b, and the arcing event counter algorithm of FIG. 6 performed by the arc fault detection apparatus of FIG. 1a;

DETAILED DESCRIPTION OF THE INVENTION

The entire disclosure of U.S. patent application Ser. No. 10/937,487 filed Sep. 9, 2004 entitled METHOD FOR DETECTING ARC FAULTS is incorporated herein by reference.

Figure 1A:
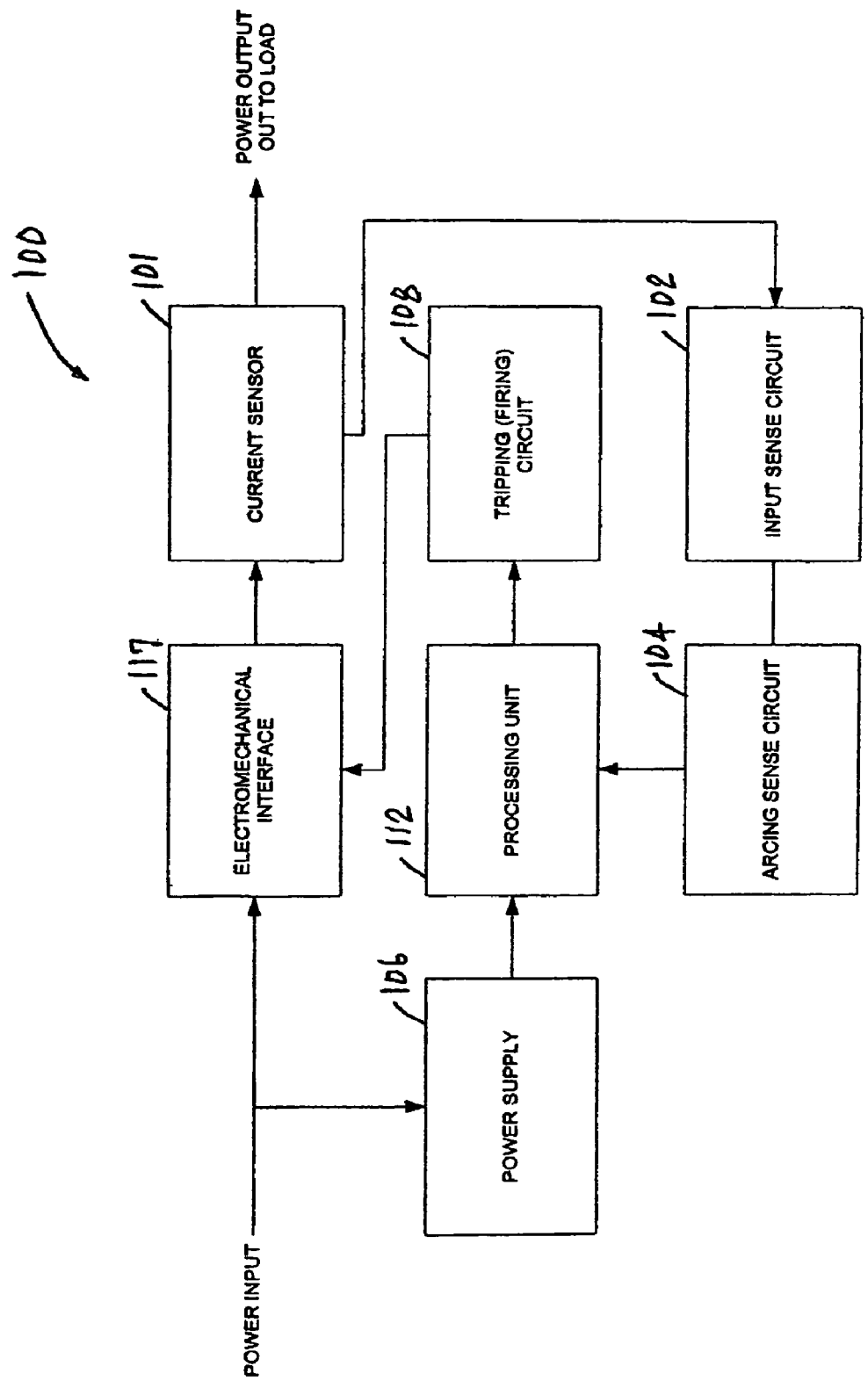
FIG. 1a is a block diagram of an arc fault detection apparatus according to the present invention.

FIG. 1a depicts an illustrative embodiment of an arc fault detection apparatus 100, in accordance with the present invention. In the illustrated embodiment, the apparatus 100 comprises a current sensor 101, an input sense circuit 102, an arcing sense circuit 104, a power supply 106, a tripping (firing) circuit 108, a processing unit 112, and an electromechanical interface 117. In an illustrative mode of operation, the current sensor 101 monitors a power input via an electromechanical interface 117, and provides high frequency components of the power input to the input sense circuit 102. Next, the input sense circuit 102 filters and rectifies the AC signal at its input, and provides the rectified signal to the arcing sense circuit 104. The arcing sense circuit 104 then provides voltage levels and digital signals indicative of possible electrical arcing to the processing unit 112. Next, the processing unit 112 measures the voltage levels and analyzes the voltage measurements and the digital signals using one or more algorithms to determine whether the signals resulted from an arc fault or a nuisance load. In the event the signals resulted from an arc fault, the processing unit 112 activates the firing circuit 108, thereby tripping the electromechanical interface 117 to disconnect the power output from the load. By determining whether the AC signal sensed by the input sense circuit 102 resulted from an electrical arc fault or a nuisance load before tripping the electromechanical interface 117, the processing unit 112 reduces the susceptibility of the arc fault detection apparatus 100 to nuisance tripping.

Figure 1B:
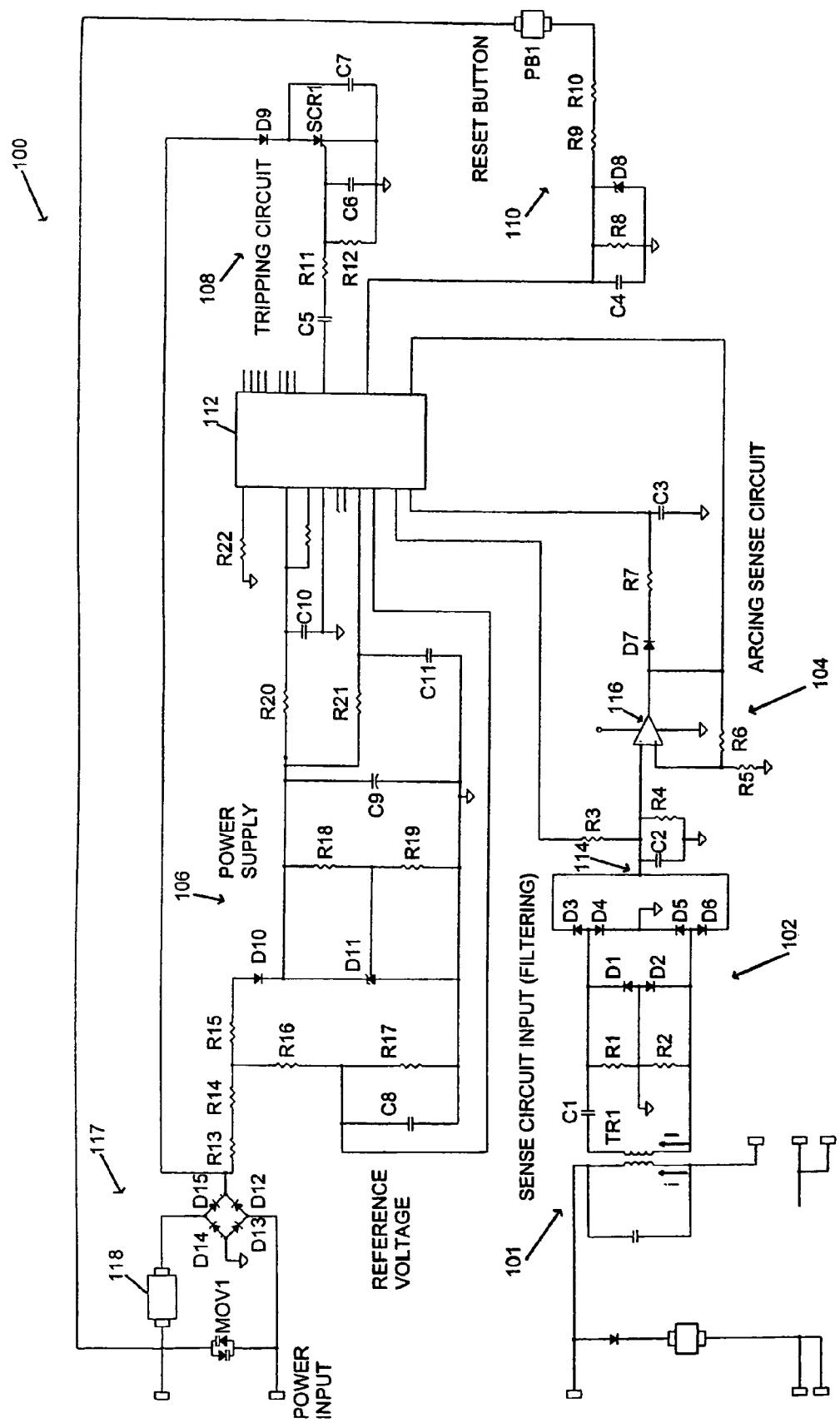
Figure 2:
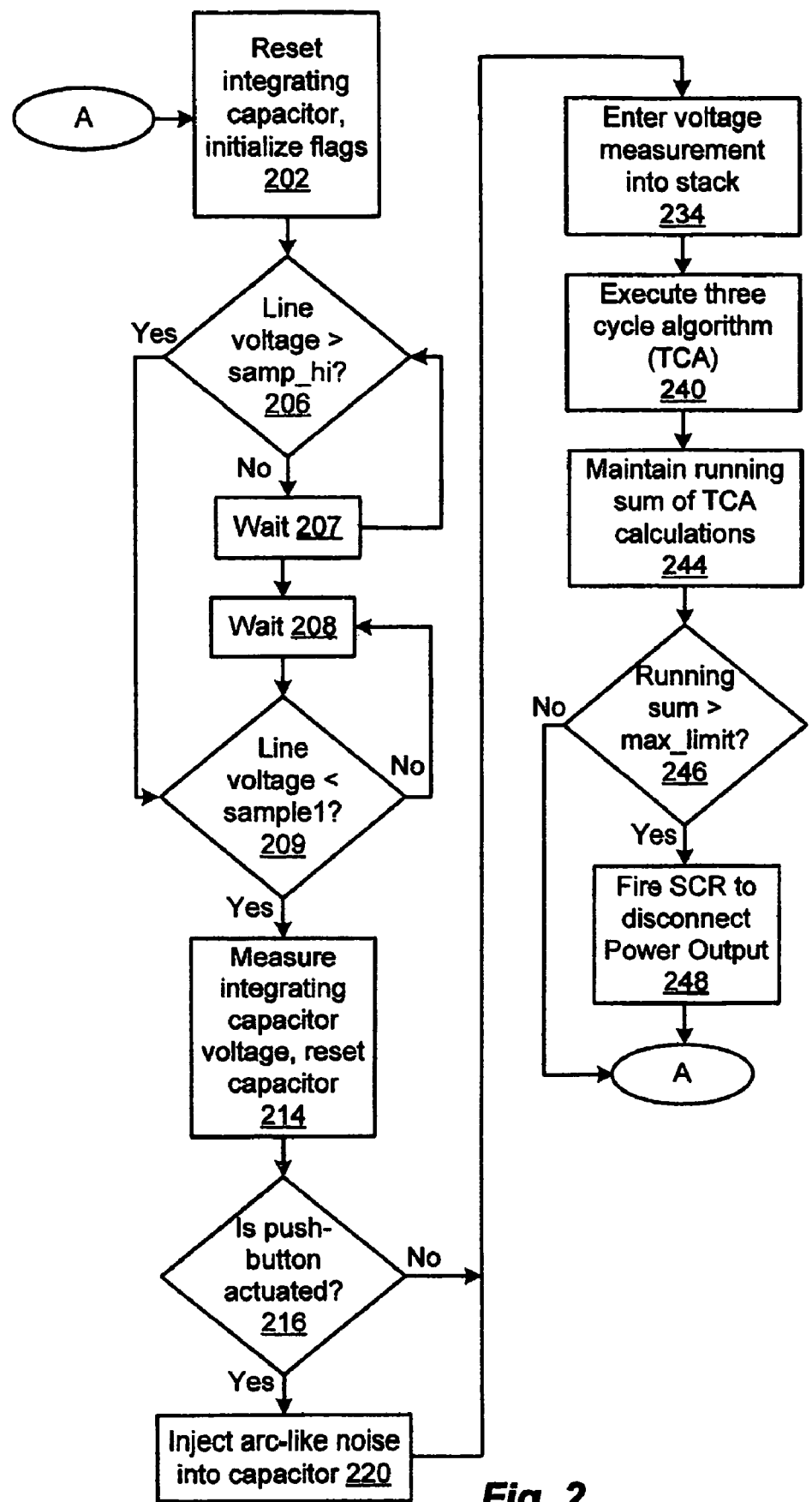

FIG. 1b depicts an illustrative implementation of the arc fault detection apparatus 100. In the illustrated embodiment, the current sensor 101 includes a transformer TR1, which monitors the power input by monitoring an alternating current (AC) i flowing through a load coupleable to the power output via a load line phase terminal TP9 and load neutral terminals TP10 and TP22. The transformer TR1 is configured for magnetically coupling the high frequency components of the AC current i from its primary coil L1 to its secondary coil L2, thereby providing an AC current I to the input sense circuit 102. In the presently disclosed embodiment, the arc fault detection apparatus 100 is implemented on a substrate such as a laminated printed circuit board (PCB) substrate, a ceramic substrate, or any other suitable substrate. Further, the primary coil L1 of the transformer TR1 surrounds the secondary coil L2 (see FIGS. 2c-2d), which has a magnetic axis perpendicular to the substrate. In the preferred embodiment, the secondary coil L2 of the transformer TR1 provides a relatively weak magnetic coupling. For example, the weakly coupled transformer TR1 may provide a mutual conductance of about 20-50 µH.

As shown in FIG. 1b, the input sense circuit 102 includes a capacitor C1, resistors R1-R2, and diodes D1-D6. The secondary coil L2 of the transformer TR1 is connected between the capacitor C1 and the resistor R2. The capacitor C1 is also connected to the resistor R1, and the resistors R1-R2 are connected to ground. The capacitor C1 high pass filters the AC signal provided by the transformer secondary coil L2, and the resistors R1-R2 provide a ground reference for the secondary coil L2. The cathode of the diode D1 is connected to the capacitor C1 and the resistor R1, the cathode of the diode D2 is connected to the secondary coil L2 and the resistor R2, and the anodes of the diodes D1-D2 are connected to ground. The cathode of the diode D1 is also connected to the anodes of the diodes D3-D4, and the cathode of the diode D2 is also connected to the anodes of the diodes D5-D6. The cathodes of the diodes D4-D5 are connected to ground, and the cathodes of the diodes D3 and D6 are connected to a node 114 providing the output of the input sense circuit 102. The diodes D1-D2 and D4-D5 are configured to form a full wave rectified bridge, and therefore the output provided at the node 114 is a full wave rectified signal. In the preferred embodiment, the diodes D3 and D6 are matched to the diodes D4-D5. Further, the diodes D3-D6 and a capacitor C2 included in the arcing sense circuit 104 form a logging circuit, thereby causing the level of the output provided at the node 114 to be proportional to the log of the input of the input sense circuit 102.

In the illustrated embodiment, the arcing sense circuit 104 includes the capacitor C2, an integrating capacitor C3, resistors R3-R7, an operational amplifier (op amp) 116, and a diode D7. As shown in FIG. 1a, the capacitor C2 and the resistor R4 are connected between the node 114 and ground. Further, the resistor R3 is connected between the node 114 and pin 10 of a micro-controller, which performs the functions of the processing unit 112 (see FIG. 1a). The op amp 116 and the resistors R5-R6 are configured to form a non-inverting amplifier 105. The capacitor C2 is connected to the non-inverting input of the op amp 116, and the voltage across the capacitor C2 is buffered and provided to the integrating capacitor C3 via the diode D7 and the resistor R7. The capacitor C3 is connected between pin 9 of the micro-controller 112 and ground. The diode D7 is configured to prevent reverse current flow from the capacitor C3. Further, the combination of the resistor R7 and the capacitor C3 forms a low pass filter to filter out high frequency noise.

It is noted that the voltage across the capacitor C2 resets with a decay time of about (C2)*(R4) seconds. For example, if R4 equals 10 kΩ and the capacitor C2 equals 1 nf, then the decay time of the capacitor C2 is about 10 µsec. The arcing sense circuit 104 is configured to convert a change in voltage across the capacitor C2 ($\Delta V_{C2}$) into a pulse having a width tpw, which may be determined from $$G*\Delta V_{C2}*e^{(-tpw/C2*R4)}=Vcc/2, \quad (1)$$

in which "G" is the gain of the op amp 116. Each pulse generated in response to a significant di/dt event ("an arcing event") causes a change in voltage across the capacitor C3 ($\Delta V_{C3}$), which may be expressed as $$\Delta V_{C3}=(Vcc-Vbe-V_{C3})*(1-e^{(-tpw/C3*R7)})-V_{C3}. \quad (2)$$

Accordingly, equations (1)-(2) demonstrate that as the number of arcing events increases, $\Delta V_{C3}$ increases with the log of $\Delta V_{C2}$, thereby increasing the dynamic range of the arc fault detection apparatus 100.

The micro-controller 112 is operative to take measurements of the voltage $V_{C3}$ across the integrating capacitor C3 at pin 9 of the micro-controller. For example, the micro-controller 112 may comprise a MSP430F1122 micro-controller sold by Texas Instruments Inc. (TI), Dallas, Tex., USA, or any other suitable micro-controller. In one embodiment, the micro-controller 112 measures the voltage $V_{C3}$ across the capacitor C3 once each half cycle of the line voltage near the line voltage zero crossing. The measured voltages represent the sum of voltages accumulated by the integrating capacitor C3, which is reset via a simple decay time. Accordingly, a sampling period during which each measurement is made has a duration starting when an arcing event occurs and lasting for about a decay time.

In alternative embodiments, the micro-controller 112 measures the voltage $V_{C3}$ across the integrating capacitor C3 multiple times per half cycle of the line voltage. For example, the micro-controller 112 may measure the voltage $V_{C3}$ twice each half cycle at times determined by the absolute value of the line voltage, and reset the capacitor C3 to 0 volts following each measurement. Specifically, the micro-controller 112 measures the voltage $V_{C3}$ at times corresponding to two predetermined regions of each half cycle. The micro-controller 112 then sums these measurements by first resetting the capacitor C3 to 0 volts at the beginning of each predetermined region, and then measuring the capacitor voltage at the end of each region. In the preferred embodiment, both voltage measurements per half cycle are made near the line voltage zero crossing, e.g., one measurement is made just before the zero crossing, and the other measurement is made just after the zero crossing.

In the presently disclosed embodiment, pin 9 of the micro-controller 112 is connected to an analog to digital converter (ADC) within the micro-controller 112. The ADC converts the analog voltage measurements taken across the integrating capacitor C3 to digital data, thereby allowing the micro-controller 112 to store the measurement data in internal memory. Following each measurement, the micro-controller 112 shorts pin 9 to ground to prepare the capacitor C3 to integrate current for the next sampling period. In addition, pin 10 of the micro-controller 112 is connected to the output of the op amp 116, which provides a pulse counter signal directly to pin 13 of the micro-controller 112. The micro-controller 112 employs an internal counter to monitor the pulse counter signal to keep track of pulses occurring within the signal. The micro-controller 112 then stores data relating to the measured voltages and the monitored pulses, and processes the data using one or more algorithms to determine whether the voltages/pulses were generated by an electrical arc fault or a nuisance load.

The arc fault detection apparatus 100 further comprises a reset circuit 110, which includes a capacitor C4, resistors R8-R10, a zener diode D8, and a pushbutton PB1 operable to connect the line phase to pin 12 of the micro-controller 112. In the illustrated embodiment, the serially connected resistors R9-R10 and the resistor R8 connected between pin 12 and ground reduce the line voltage and the line current to levels suitable for the micro-controller 112. Even though the TI MSP430F1122 micro-controller includes internal protection diodes, the zener diode D8 is connected between pin 12 and ground to provide a redundant voltage limitation. The capacitor C4 is connected between pin 12 and ground to filter out high frequency noise. When the pushbutton PB1 is actuated to initiate a test, the micro-controller 112 provides a sense test signal having an increasing pulse width at pin 10. As a result, the micro-controller 112 applies increasing voltage to the capacitor C2 through the resistor R3 as the width of the pulse increases, thereby creating simulated electrical arcing at varying voltages.

As shown in FIG. 1b, the firing circuit 108 includes capacitors C5-C7, resistors R11-R12, a diode D9, and a silicon controlled rectifier (SCR1). Specifically, the capacitor C7 is connected between the anode and the cathode of the SCR1, and the capacitor C6 and the resistor R12 are connected between the gate and the cathode of the SCR1 to prevent an unintentional turn-on of the SCR1 by a significant dv/dt event. The capacitor C5 is serially connected between pin 14 of the micro-controller 112 and the current limiting resistor R11 to prevent excessive depletion of the power supply. The electromechanical interface 117 includes a diode bridge including diodes D12-D15, a solenoid 118, and a metal oxide varistor (MOV1) connected between the line neutral and line phase terminals to prevent excessive line voltage. The diode D9 is connected between the diode bridge D12-D15 and the anode of the SCR1. The diode D9 isolates the capacitor C7 from a line voltage monitoring circuit including the resistors R16-R17 and the capacitor C8 connected to pin 8 of the micro-controller 112. Accordingly, when the SCR1 is turned on, the SCR1 draws increased current through the diode bridge D12-D15, and a voltage level approximately equal to the line voltage trips the solenoid 118 to disconnect the power output from the load.

In the illustrated embodiment, the power supply 106 includes resistors R13-R20, capacitors C8-C10, and diodes D10-D11. The serially connected resistors R13-R15 limit the amount of current provided to the zener diode D11. As shown in FIG. 1b, the resistor R20 is connected between the junction of the diode D10 and the zener diode D11 and the positive supply Vcc (pin 2) of the micro-controller 112. The diode D10 prevents reverse current flow from the capacitor C9, which is connected between the junction of the diodes D10-D11 and ground. Further, the capacitor C10, which is connected between pin 2 of the micro-controller 112 and ground, provides the voltage Vcc to the micro-controller 112. The serially connected resistors R16-R17 are connected between the junction of the resistors R14-R15 and ground. Further, the capacitor C8, which is connected between the junction of the resistors R16-R17 and ground, provides a reference voltage (VREF) to pin 8 of the micro-controller 112. The reference voltage VREF is proportional to the voltage of the diode bridge D12-D15, which is approximately equal to the absolute value of the line voltage. In the presently disclosed embodiment, the micro-controller 112 monitors the line voltage via VREF, and determines when to perform measurements of the voltage across the capacitor C3 based on the monitored line voltage. In an alternative embodiment, the micro-controller 112 may monitor the output of a digital timer and perform voltage measurements across the integrating capacitor C3 based on the timer output.

As described above, the micro-controller 112 determines the occurrence of arcing events by processing stored voltage/pulse data using one or more algorithms. A method of operating the arc fault detection apparatus 100 that employs a three cycle algorithm (TCA) to reduce the occurrence of tripping on nuisance loads is described below with reference to FIGS. 1b and 2. As depicted in step 202, the integrating capacitor C3 is reset to 0 volts and all flags within the micro-controller 112 are initialized. Steps 206-209 form a subroutine in which the method continues to loop until the reference voltage VREF monitored at pin 8 of the micro-controller 112 exceeds a predetermined value samp_hi and then goes below a selected value sample1, thereby defining a sampling or measurement point near the line voltage zero crossing. A measurement of the voltage across the capacitor C3 is then made, as depicted in step 214, at pin 9 of the micro-controller 112, after which the capacitor C3 is reset to 0 volts. Next, a determination is made, as depicted in step 216, as to whether the pushbutton PB1 is actuated. In the event the pushbutton PB1 is actuated, electrical arc-like noise is injected, as depicted in step 220, into the capacitor C2 through the resistor R3 connected to pin 10 of the micro-controller 112 which, with sufficient noise injected over a plurality of half cycles of the line voltage and processed by the TCA in step 240 described below, causes the solenoid 118 to trip in the same manner as a detected electrical arc in the load current.

In the preferred embodiment, because a minimal voltage is required to sustain an electrical arc, e.g., about 15 volts, a window typically up to 50 volts is selected for voltage measurement to account for phase differences between the line current and the line voltage. This window around the line voltage zero crossing captures relatively small arcs that are typically generated or extinguished near the zero crossing.

Next, the voltage measurement is converted to digital form and pushed, as depicted in step 234, onto a stack within the micro-controller 112 to maintain a history of measurement data. In the presently disclosed embodiment, successive voltage measurement values are entered as words into the stack. The TCA is then executed, as depicted in step 240. Specifically, the word of cycle 1 (i.e., V[n−1]) minus the word of cycle 2 (i.e., V[n]) is calculated and the absolute value is taken to obtain a first calculated value, the word of cycle 3 (i.e., V[n+1]) minus the word of cycle 2 (i.e., V[n]) is calculated and the absolute value is taken to obtain a second calculated value, and the word of cycle 3 (i.e., V[n+1]) minus the word of cycle 1 (i.e., V[n−1]) is calculated and the absolute value is taken to obtain a third calculated value. The first value plus the second value minus the third value is then calculated and the absolute value is taken. The TCA executed in step 240 may therefore be expressed as $$TCA = |(|V_{[n-1]} - V_{[n]}| + |V_{[n+1]} - V_{[n]}| - |V_{[n+1]} - V_{[n-1]}|)|. \quad (3)$$

It is understood that the outermost pair of absolute value signs in equation (3) are not strictly required, but are included to emphasize the need to avoid the occurrence of least significant bit (LSB) errors during execution of the TCA. It is noted that the adjacent full cycles 1-3 employed in the TCA may or may not be overlapping. If the three cycles are not overlapping, then six half cycles are required to execute the TCA. If the three cycles are overlapping, then only four half cycles are required for the TCA.

Next, at least one continuous running sum of TCA calculations is maintained, as depicted in step 244. Each running sum of TCA calculations represents the total amount of electrical arcing that occurs over a respective sampling period. At the end of the sampling period, a determination is made, as depicted in step 246, as to whether the running sum exceeds a predetermined maximum threshold value max_limit. In the event the running sum value exceeds max_limit, an arc fault is detected and the SCR1 is fired, as depicted in step 248, to disconnect the power output from the load. In the preferred embodiment, the SCR1 is fired three times to assure firing even if there is a brief interruption of the line voltage. In the presently disclosed embodiment, a pulse having a selected width, e.g., 30 μsec, is provided to the SCR1. The method then loops back to step 202 to prepare the integrating capacitor C3 for subsequent voltage measurements.

Figure 3:
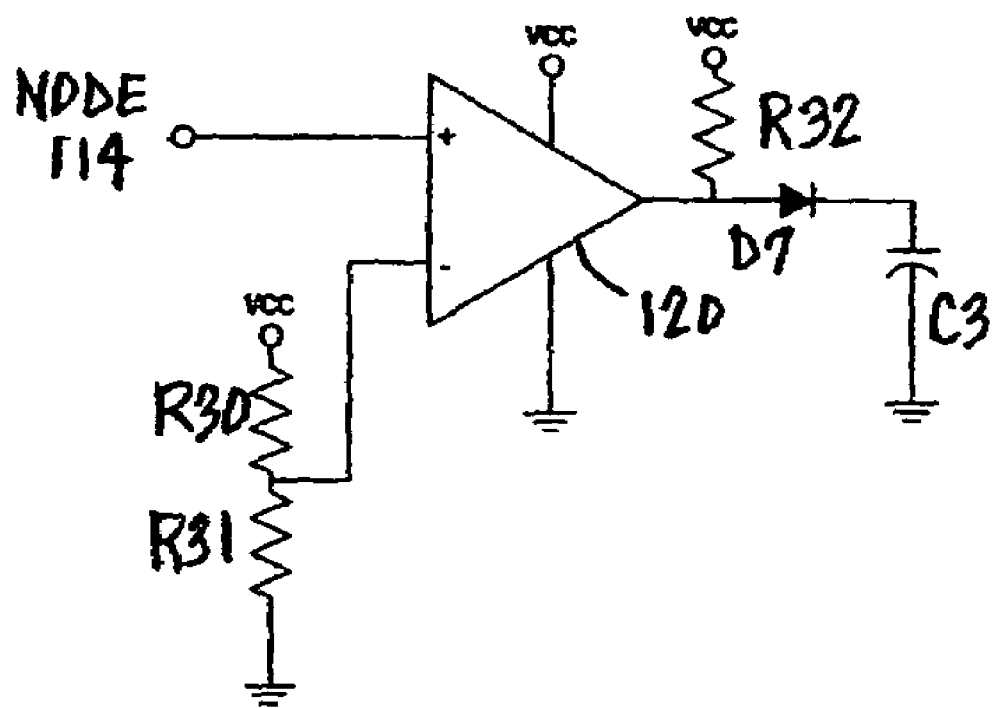

Having described the above illustrative embodiments, other alternative embodiments or variations may be made. For example, it was described that the arcing sense circuit 104 (see FIG. 1b) includes the op amp 116 and the resistors R5-R6, which form a non-inverting amplifier 105. FIG. 3 depicts a comparator circuit 105a that may be employed in place of the non-inverting amplifier 105. As shown in FIG. 3, the comparator circuit 105a includes a comparator 120, resistors R30-R32, the diode D7, and the capacitor C3. Specifically, the resistors R30-R31 form a voltage divider that biases the inverting input of the comparator. When the level of the signal provided to the non-inverting input of the comparator 120 by the input sense circuit 102 exceeds the level at the inverting input of the comparator 120, the comparator 120 charges the capacitor C3 through the resistor R32 at a rate proportional to $(R32)*(C3)$. It is noted that the capacitor C3 continues to charge the capacitor C3 so long as the signal level at the non-inverting input of the comparator 120 remains greater than $Vcc*[R31/R30+R31)]$. Accordingly, each time a significant change in load current is detected at the input of the comparator circuit 105a (i.e., each time a significant di/dt event occurs), the output of the comparator is driven to its positive rail, thereby generating a pulse for charging the capacitor C3 through the diode D7 and the resistor R7.

In the presently disclosed embodiment, the micro-controller 112 is operative to execute a first pulse counter algorithm to count the number of times the output of the comparator circuit 105a (or the non-inverting amplifier 105) is driven high during each half cycle. Due to the generally chaotic nature of electrical arcing, arc faults typically produce varying numbers of arcing events per half cycle of the line voltage. In contrast, nuisance loads typically produce the same number of arcing events per half cycle, and may therefore produce arcing events periodically over multiple half cycles. Such information may be used to inhibit nuisance tripping under normal operating conditions, and to allow tripping to occur when electrical arc faults are detected. Specifically, the comparator circuit 105a provides the pulse counter signal to pin 13 of the micro-controller 112, which uses this signal during the execution of the first pulse counter algorithm. Each time the output of the comparator circuit 105a is driven high during each half cycle, as indicated by the level of the pulse counter signal, a digital counter within the micro-controller 112 is incremented. When the capacitor C3 is reset by the micro-controller 112, the counter value is stored within the micro-controller 112, and the first pulse counter algorithm is executed. In the presently disclosed embodiment, the micro-controller 112 executes the first pulse counter algorithm to determine the periodicity of a predetermined number of data elements in one or more measurement data sets stored in the micro-controller 112. For example, in the event the stored counter value is equal to four, the first pulse counter algorithm may be used to determine the periodicity of 1-4 data elements in at least one measurement data set.

Figure 4A:
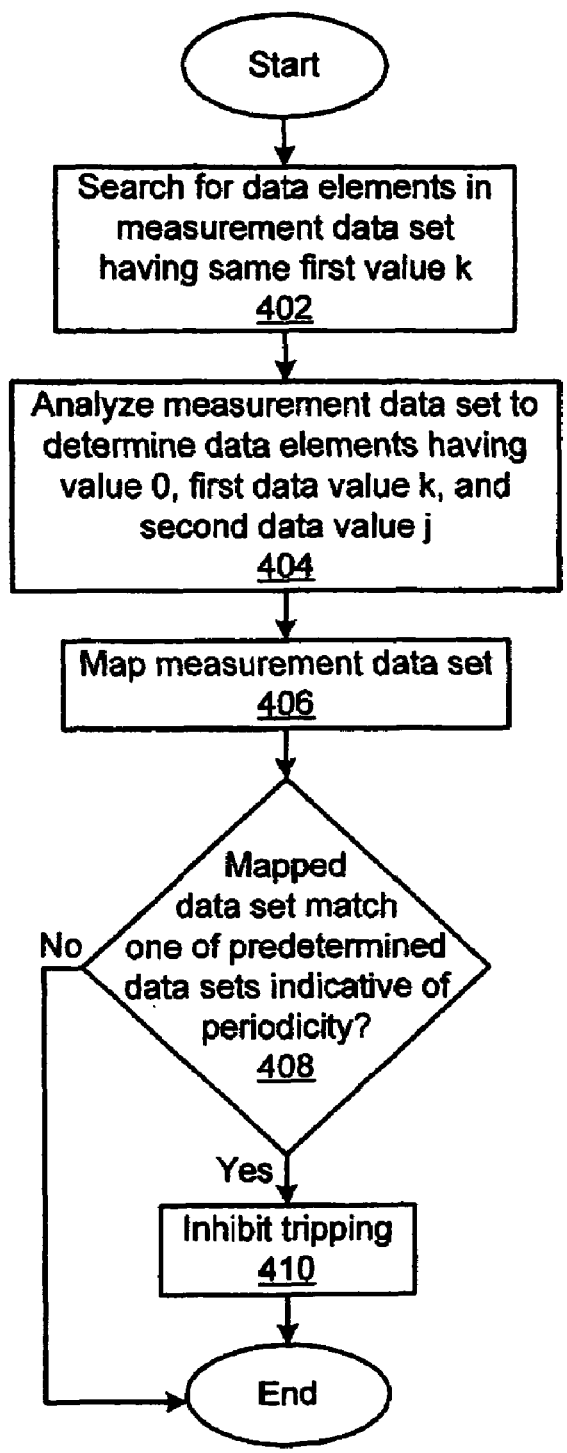
Figure 4B:
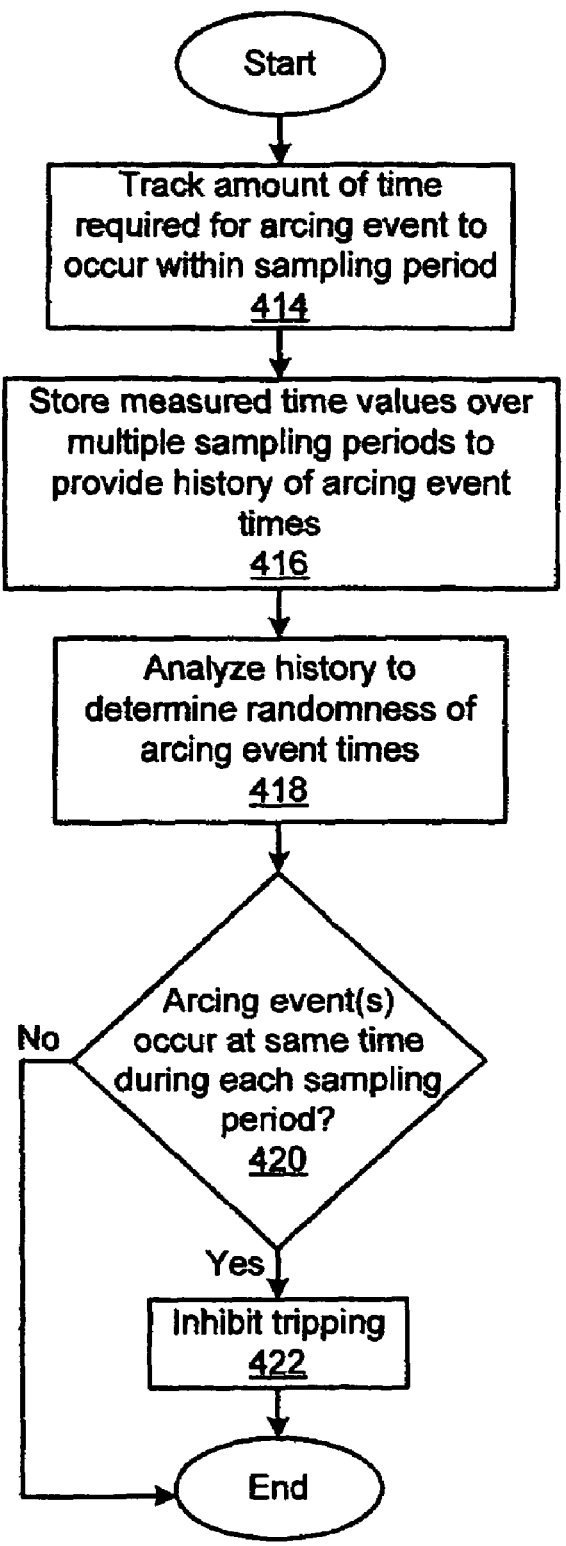
Figure 6:
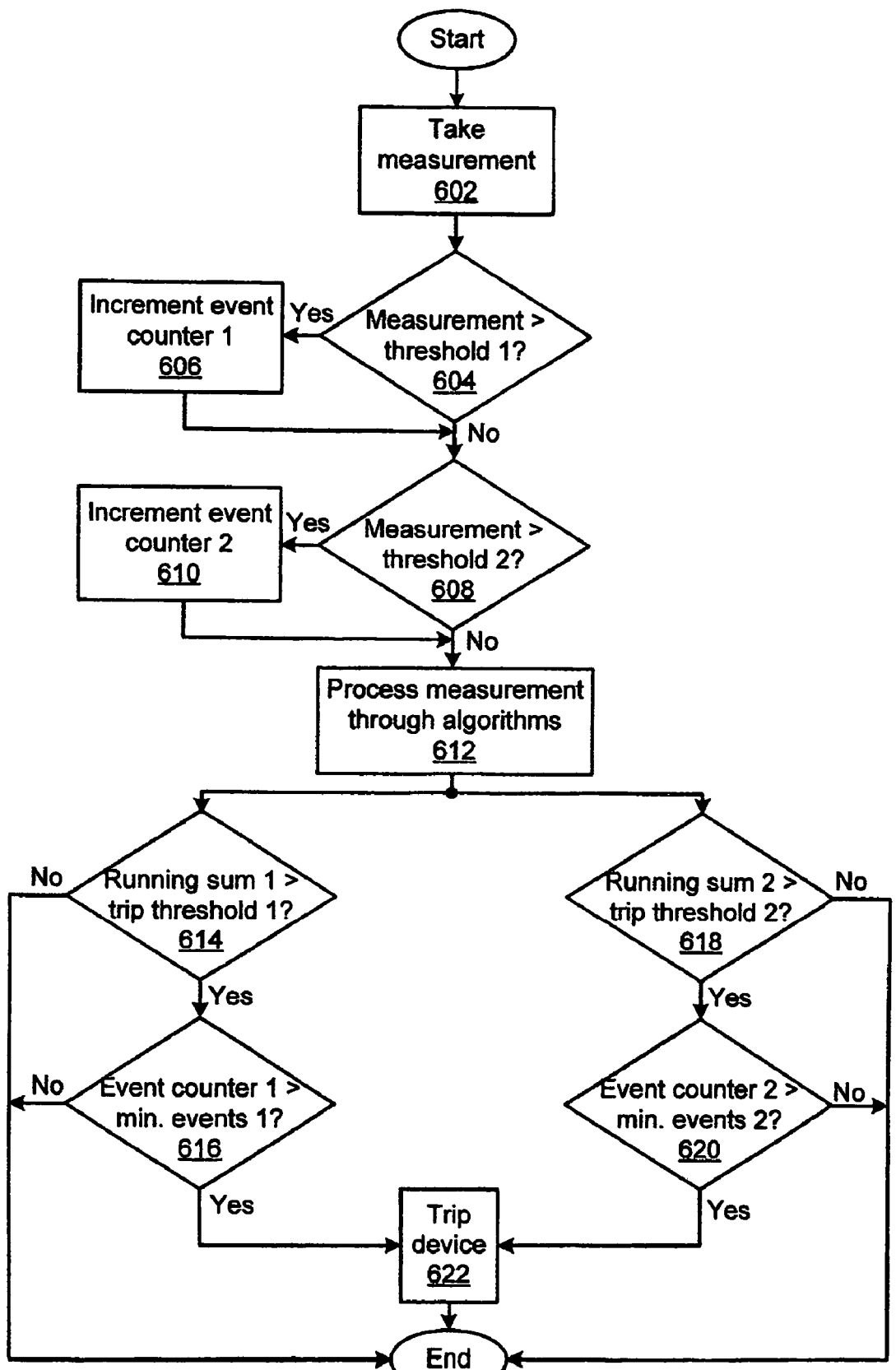

The operation of the first pulse counter algorithm is described below with reference to FIG. 4a. As depicted in step 402, the pulse counter algorithm searches for a predetermined number of data elements in a set of measurement data having the same first data value k. The entire measurement data set is then analyzed, as depicted in step 404, to determine the presence of data elements having a value of zero (0's), to determine the presence of additional data elements having the first data value (k's), and to determine the presence of data elements having a second data value different from the first data value (j's). Next, the data set is mapped, as depicted in step 406. For example, an exemplary data set may contain a first data element having a zero value, a second data element having a first value of 3, a third data element having the same first value of 3, and a fourth data element having a different second value of 2, and may therefore be mapped to [0,k,k,j]. Next, a determination is made, as depicted in step 408, as to whether the mapped data set matches at least one of a plurality of predetermined data sets indicative of the periodicity of multiple arcing events. As explained above, nuisance loads typically produce periodic arcing events, while arcing events produced by arc faults are typically non-periodic. In addition, certain start-up and shutdown conditions may resemble periodic arcing events. FIG. 6 depicts an illustrative mapping of a plurality of data sets indicative of periodic arcing events. For example, the exemplary mapping [0,k,k,j] described above does not match any of the data sets shown in FIG. 6. In this case, the pulse counter is not regarded as being "active" (N) and tripping is allowed. In the event a match is made, as depicted in step 410, the pulse counter is regarded as being "active" (Y) and tripping is inhibited, thereby reducing the occurrence of nuisance tripping under normal operating conditions. For example, tripping may be inhibited by increasing the predetermined maximum threshold value max_limit and/or any other suitable constant and/or coefficient employed by the above-described three cycle algorithm (TCA). It is understood that the constants/coefficients employed by the TCA may also be suitably modified to enable tripping when significant arc faults are detected.

As described above, the first pulse counter algorithm includes the step of determining whether a mapped data set matches at least one predetermined data set indicative of the periodicity of an arcing event. In an alternative embodiment, a determination may also be made as to whether the mapped data set matches one or more predetermined data sets indicative of insignificant events (e.g., noise) in the data history. For example, such a data set may map to [0,k,k,j,k,k], which would be indicative of periodicity but for the single "j" element in the mapping. By inhibiting tripping when such a match occurs, a degree of noise filtering may be incorporated into the first pulse counter algorithm.

In the presently disclosed embodiment, a second pulse counter algorithm is also executed to capture timing information relating to one or more arcing events. The second pulse counter algorithm is described below with reference to FIG.

4b. As depicted in step 414, the counter within the micro-controller 112 is employed to track the amount of time required for an arcing event to occur within the sampling period. For example, the counter may be used to measure the time from the beginning of the sampling period to the occurrence of an arcing event within the sampling period. A plurality of measured time values is then stored, as depicted in step 416, over a number of sampling periods to provide a history of arcing event times. Next, the time history is analyzed, as depicted in step 418, to determine the randomness of the arcing times. A determination is then made, as depicted in step 420, as to whether an arcing event occurs at substantially the same time during each sampling period. In the event the arcing occurs at substantially the same time during each sampling period, the arcing is deemed to be caused by a nuisance load and tripping is inhibited, as depicted in step 422. It is understood that the constants/coefficients employed by the above-described three cycle algorithm may be suitably modified to inhibit and/or enable tripping based on the arc timing history obtained by the second pulse counter algorithm.

It was also described that the TCA may be expressed as $$TCA = |(|V_{[n-1]} - V_{[n]}| + |V_{[n+1]} - V_{[n]}| - |V_{[n+1]} - V_{[n-1]}|)|$$

(see equation (3)). However, equation (3) provides a relatively smooth response to single arcing events. To achieve a response to single arcing events that is more characteristic of an impulse, a modified TCA may be expressed as $$\text{Knob\_}TCA = TCA\_1 + (\text{knob}) * TCA\_2, \quad (6)$$

in which "TCA_1" is expressed as equation (3), "knob" is a constant, and "TCA_2" is expressed as $$TCA\_2 = |V_{[n-1]} - 2 * V_{[n]} + V_{[n+1]}|, \quad (7)$$

in which V[n−1] represents a first voltage measurement corresponding to a first cycle of the line voltage, V[n] represents a second voltage measurement corresponding to a second cycle of the line voltage, and V[n+1] represents a third voltage measurement corresponding to a third cycle of the line voltage. It is noted that TCA_2 provides more of an impulse response to single arcing events. In equation (6) above, the knob constant may be adjusted (e.g., the knob constant may be set to ⅛ or any other suitable value) to provide varying amounts of impulse response.

It was also described that the resulting sum of the three cycle algorithm (TCA) is added to a continuous running sum of TCA calculations that represents the total amount of electrical arcing occurring over the sampling period. At the end of each sampling period, the running sum is compared to the predetermined maximum threshold value max_limit, and the SCR1 is fired in the event the threshold is exceeded. In an alternative embodiment, to further avoid nuisance tripping, the micro-controller 112 (see FIG. 1) is operative to execute an arcing event counter algorithm to count the number of arcing events included in the running sum.

The arcing event counter algorithm is described below with reference to FIG. 6. As depicted in step 602, the voltage across the capacitor C3 is measured. Next, a determination is made, as depicted in step 604, as to whether the measured voltage value exceeds a first predetermined threshold value. If the measured voltage value exceeds the first threshold value, then a first event counter within the micro-controller 112 is incremented, as depicted in step 606. Next, at least one second determination is optionally made, as depicted in step 608, as to whether the measured voltage value exceeds a second predetermined threshold value. If the measured voltage value exceeds the second threshold value, then a second event counter within the micro-controller 112 is incremented, as depicted in step 610. Next, the measurement of the voltage across the capacitor C3 is processed, as depicted in step 612, by at least one algorithm such as the TCA described above. In the preferred embodiment, the voltage measurement is then added to first and second running sums of voltage measurements. For example, the first running sum of voltage measurements may correspond to a short sampling period during which large voltage spikes are monitored over a short period of time, and the second running sum of voltage measurements may correspond to a long sampling period during which smaller voltage spikes are monitored over a longer period of time. As depicted in step 614, a determination is made as to whether the first running sum (running sum 1) exceeds a first predetermined trip threshold (trip threshold 1). In the event the first running sum value exceeds the first trip threshold value, a determination is made, as depicted in step 616, as to whether the output of the first event counter (event counter 1) exceeds a first predetermined minimum number of events (min. events 1). In the event the first event counter output exceeds the first number of events, tripping occurs, as depicted in step 622, to disconnect the power output from the load. As depicted in step 618, a determination is made as to whether the second running sum (running sum 2) exceeds a second predetermined trip threshold (trip threshold 2). In the event the second running sum value exceeds the second trip threshold value, a determination is made, as depicted in step 620, as to whether the output of the second event counter (event counter 2) exceeds a second predetermined minimum number of events (min. events 2). In the event the second event counter output exceeds the second number of events, tripping occurs, as depicted in step 622, to disconnect the power output from the load. Accordingly, if either the first event counter output exceeds the first predetermined count number or the second event counter output exceeds the second predetermined count number, then tripping occurs. Otherwise, no tripping takes place.

In this way, nuisance tripping due to, e.g., noisy switching signals is avoided. Although such noisy signals may result in relatively large voltage measurements, they are not necessarily indicative of electrical arcing. By monitoring the level of the running sum of measured voltages, and by tracking the number of arcing events included in the running sum, electrical arcing containing several half cycles of arcing events can be more reliably detected, and nuisance loads containing only a limited number of arcing events can be more safely ignored.

It was also described that the micro-controller 112 monitors the line voltage via VREF, and determines when to perform measurements of the voltage across the capacitor C3 based on the monitored line voltage. Under normal operating conditions, the time between these voltage measurements is regular and periodic. However, during high current arcing conditions, the VREF signal can become degraded due to a line voltage drop out caused by a momentary hard short circuit. If the micro-controller 112 is looking for a specific voltage point on the half cycle of the line voltage, then such a voltage drop out could cause an inadvertent or early command to measure. In addition, during this type of arcing event, the voltage on the integrating capacitor C3 is typically excessively high. During a normal line drop out (or brown out), a purported measurement point may be found by the micro-controller, but there may be no abnormal voltage on the capacitor C3. In contrast, during a high current arcing condition, a purported measurement point may be found and an excessively high voltage may be detected on the capacitor C3. Accordingly, to detect high level arcing, the micro-controller 112 is operative to measure the time between measurement points. In the event an early measurement is found and an excessively large capacitor voltage $V_{C3}$ is detected, the micro-controller activates the firing circuit 108, thereby tripping the solenoid 118 to disconnect the power output from the load.

It was also described that the micro-controller 112 (see FIG. 1) may take measurements of the voltage across the capacitor C3 twice each half cycle, convert the voltage measurements to digital form using an analog to digital converter (ADC), store the measured voltage data, and discharge the capacitor C3 when the voltage measurements are completed. It is noted that the voltage across the capacitor C3 represents the integral of the signal provided by the non-inverting amplifier 105. In an alternative embodiment, a digital counter within the micro-controller 112 is employed as an accumulator for effectively integrating the output of the non-inverting amplifier 105, thereby obviating the need for the integrating capacitor C3 and the ADC.

Figure 7:
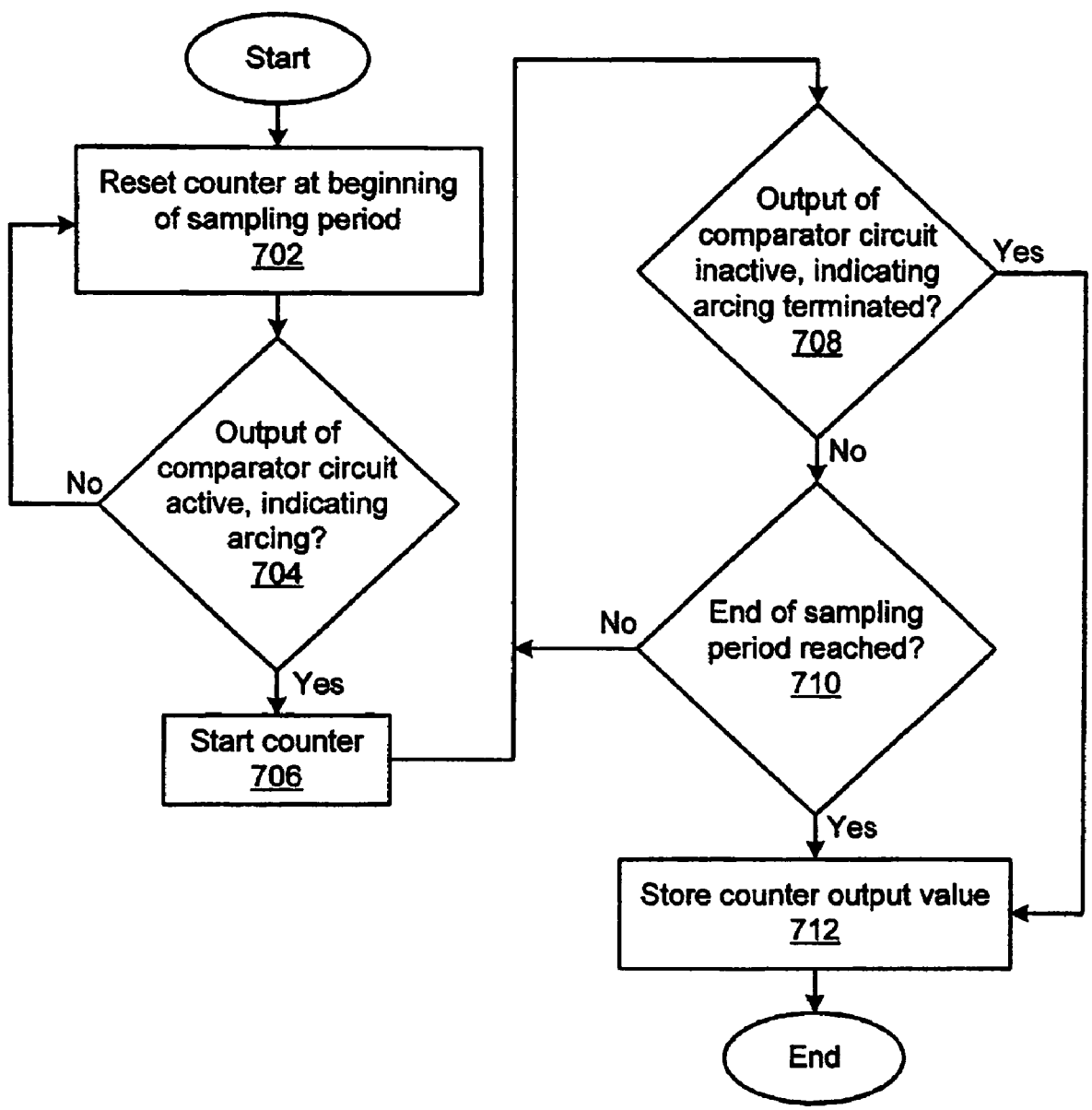

In this alternative embodiment, the comparator circuit 105a or 105b is used in place of the non-inverting amplifier 105, and the digital output(s) of the comparator circuit is provided directly to the micro-controller 112 for incrementing the internal counter. Further, the sampling period is defined as having a duration corresponding to one or more half cycles of the line voltage. The operation of the micro-controller 112 and the internal counter for integrating the output of the comparator circuit 105a is described below with reference to FIG. 7. As depicted in step 702, the counter is reset at the beginning of the sampling period. Next, a determination is made, as depicted in step 704, as to whether the output of the comparator circuit 105a is active, thereby indicating the presence of electrical arcing. In the event the comparator circuit output is active, the counter is started, as depicted in step 706. A determination is then made, as depicted in step 708, as to whether the output of the comparator circuit 105a has become inactive, indicating the termination of electrical arcing. In the event electrical arcing has terminated, the method branches to step 712. Otherwise, a determination is made, as depicted in step 710, as to whether the end of the sampling period has been reached. In the event the end of the sampling period has been reached, the method proceeds to step 712. Otherwise, the method loops back to step 708. Next, the output value of the counter is stored, as depicted in step 712. The stored counter output, which represents the integral of the output of the comparator circuit 105a, is subsequently used in place of the voltage measurements across the integrating capacitor C3 in the arc detection algorithms described above.

Figure 8:
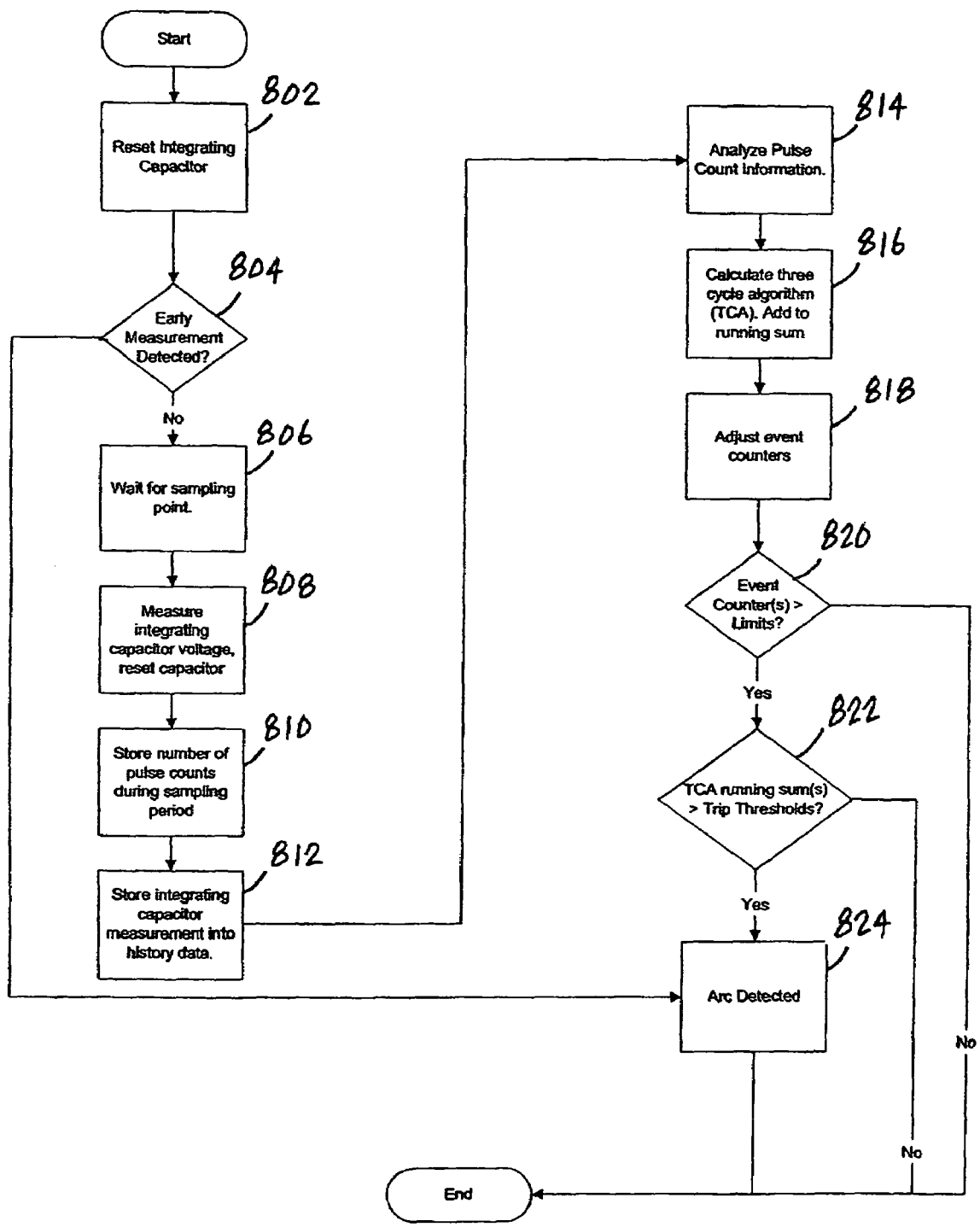

A method of operating the arc fault detection apparatus 100 that employs the pulse counter algorithm, the three cycle algorithm (TCA), and the arcing event counter algorithm is illustrated by reference to FIGS. 1b and 8. As depicted in step 802, the integrating capacitor C3 is reset to 0 volts. Next, a determination is made, as depicted in step 804, as to whether an early command to measure is detected. For example, the micro-controller 112 may detect such an early command to perform a voltage measurement if the VREF signal becomes degraded due to a line voltage drop out. In the event an early measurement is detected and an excessively large voltage across the capacitor C3 is measured, an arc fault is detected, as depicted in step 824, and the solenoid 118 is tripped to disconnect the power output from the load. Otherwise, the micro-controller 112 monitors the VREF signal and waits, as depicted in step 806, for the sampling or measurement point to arrive. When the measurement point arrives, the voltage across the integrating capacitor C3 is measured, as depicted in step 808, after which the capacitor C3 is reset to 0 volts. Next, the micro-controller 112 monitors the pulse counter signal provided by the arcing sense circuit 104 and stores, as depicted in step 810, the number of pulse counts occurring during the sampling period. In addition, the micro-controller 112 stores, as depicted in step 812, the integrating capacitor voltage measurement into the history data store (e.g., a stack). The stored pulse count information is then analyzed, as depicted in step 814, using the above-described pulse counter algorithm. Next, the three cycle algorithm (TCA) is executed, as depicted in step 816, using the stored history of voltage measurement data, and resulting TCA calculations are added to at least one running sum. One or more event counters within the micro-controller 112 are then adjusted, as depicted in step 818, and the voltage measurements are analyzed using the above-described arcing event counter algorithm. A determination is then made, as depicted in step 820, as to whether one or more event counters exceed predetermined minimum numbers of arcing events. If the event counter(s) exceeds the predetermined minimum number(s) of arcing events, another determination is made, as depicted in step 822, as to whether the TCA running sum(s) exceeds a predetermined trip threshold value. In the event the TCA running sum(s) exceeds the predetermined trip threshold, an arc fault is detected, as depicted in step 824, and the solenoid 118 is tripped to disconnect the power output from the load.

As described above, the arc fault detection apparatus 100 (see FIGS. 1a-1b) can employ the presently disclosed pulse counter algorithm, the three cycle algorithm (TCA), and the arcing event counter algorithm to reduce the occurrence of nuisance tripping. In accordance with the present invention, the arc fault detection apparatus 100 can further reduce the occurrence of nuisance tripping by performing one or more additional algorithms, in which multiple voltage levels provided by the arcing sense circuit 104 are measured during a specified number of consecutive time periods and subsequently analyzed based upon criteria such as the number of consecutive periods for which the measured levels exceeded a specified minimum value, the number of consecutive periods for which the measured levels take on successively lower or higher values, and/or whether or not one or more of the measured levels fall outside a predetermined range of values.

These additional algorithms performed by the arc fault detection apparatus 100 (see FIGS. 1a-1b) for reducing the occurrence of nuisance tripping will be better understood with reference to the following illustrative examples. In each illustrative example, the current sensor 101 monitors a power input comprising an alternating current (AC), and provides high frequency components of the AC current to the input sense circuit 102. Next, the input sense circuit 102 filters and rectifies the AC signal at its input, and provides the rectified signal to the arcing sense circuit 104, which in turn provides a plurality of voltage levels to the micro-controller 112. Each of the voltage levels provided to the micro-controller 112 by the arcing sense circuit 104 corresponds to a voltage across the integrating capacitor C3, and can represent a sum of voltages accumulated by the integrating capacitor C3 over a specified time period. The micro-controller 112 measures each voltage level, stores information relating to the measured voltage levels, and processes the stored information using one or more of these additional algorithms to determine whether the high frequency components of the AC current resulted from an electrical arc fault or a nuisance load. In the event the high frequency AC current components resulted from an arc fault, the micro-controller 112 activates the firing circuit 108 to trip the electromechanical interface 117, thereby interrupting the power output to the load.

Figure 9:
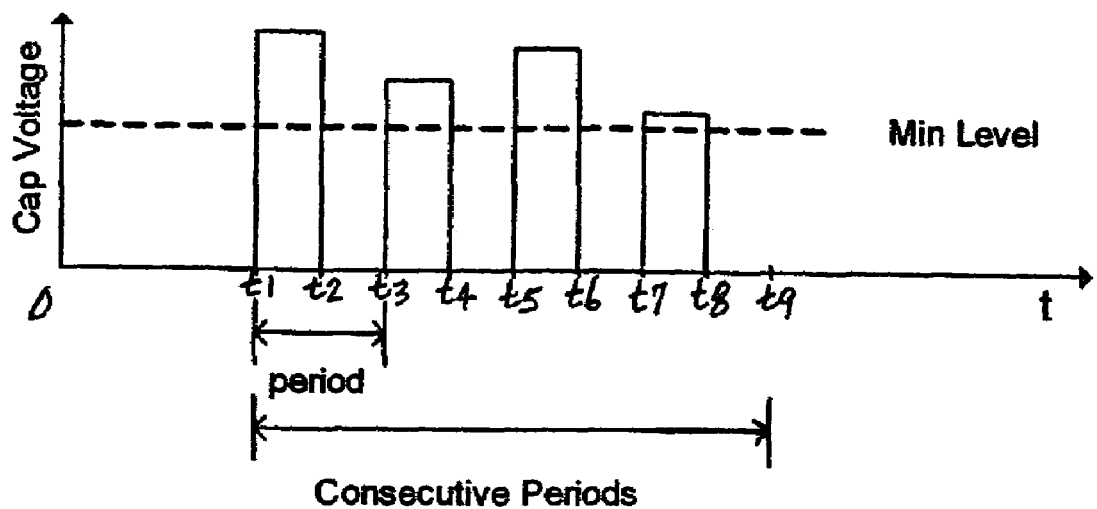
FIG. 9 is a diagram illustrating a number of consecutive periods of high voltage across an integrating capacitor included in the arc fault detection apparatus of FIG. 1a, thereby indicating a possible electrical arc fault.

In a first illustrative example, the micro-controller 112 measures multiple voltages across the integrating capacitor C3 during a specified number of consecutive time periods. FIG. 9 illustrates four such voltages occurring during four consecutive time periods. Specifically, a first voltage occurs during the time period $t_1$ to $t_3$, a second voltage occurs during the time period $t_3$ to $t_5$, a third voltage occurs during the time period $t_5$ to $t_7$, and a fourth voltage occurs during the time period $t_7$ to $t_9$. In this first example, the integrating capacitor C3 is reset at about times $t_2$, $t_4$, $t_6$, and $t_8$ during the first, second, third, and fourth time periods, respectively. For example, the micro-controller 112 can perform a single voltage level measurement during each of the four consecutive time periods, or multiple voltage level measurements during each time period. In addition, each of the four consecutive time periods can correspond to a half cycle of the line voltage, or any other suitable constant or variable time period. Next, the micro-controller 112 determines the number of consecutive time periods for which the measured voltage levels exceeded a specified minimum value. As illustrated in FIG. 9, in this first illustrative example, all four voltages corresponding to the four consecutive time periods exceeded the specified minimum value. In the event the number of consecutive time periods for which the measured voltage levels exceeded the specified minimum value is greater than or equal to a predetermined threshold, the micro-controller 112 activates the firing circuit 108 to trip the electromechanical interface 117, which interrupts the power output to the load. Accordingly, in this first example, if the predetermined threshold were equal to four, then the micro-controller 112 would activate the firing circuit 108 to interrupt the power output to the load. In this case, the high frequency components of the AC line current would be deemed to have resulted from an electrical arc fault.

It is noted that, in this first illustrative example, if the number of consecutive time periods for which the measured voltage levels exceeded the specified minimum value were less than four, then tripping of the electromechanical interface 117 would be inhibited. In this case, the high frequency components of the AC line current would be deemed to have resulted from a nuisance load. It is appreciated that a desired level of performance for reducing the occurrence of nuisance tripping can be achieved via suitable selections of the specified minimum value of the measured voltage levels, and the specified number of consecutive time periods during which the measured voltage levels exceed the specified minimum value. In addition, the coupling of the integrating capacitor C3 to the micro-controller 112 and/or the charge timing of the integrating capacitor C3 may be modified for further improving the performance of the arc fault detection apparatus 100.

Figure 10A:
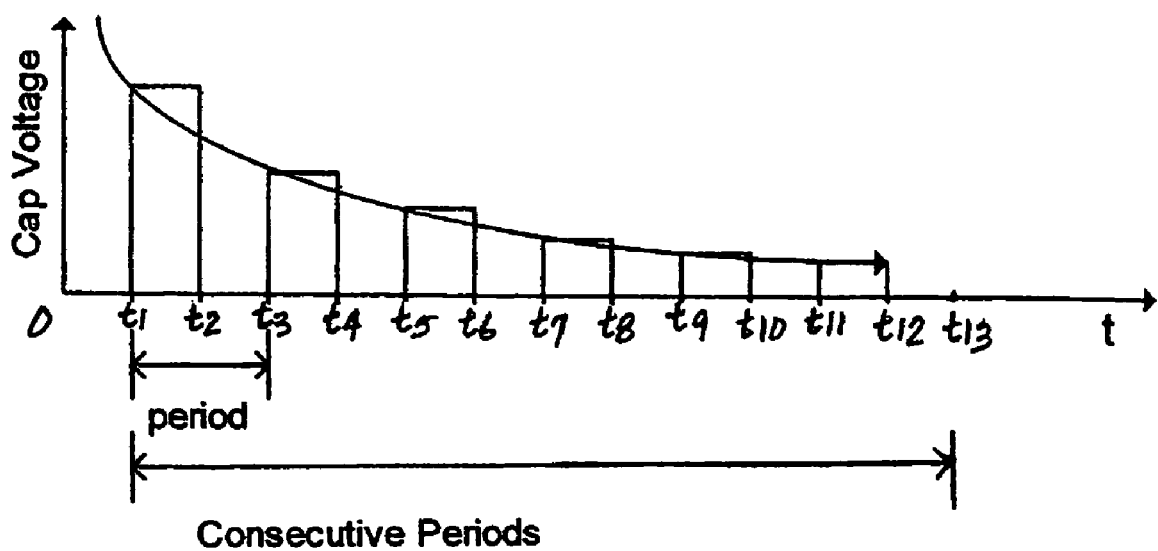
FIG. 10a is a diagram illustrating a number of consecutive periods of decreasing voltage across the integrating capacitor included in the arc fault detection apparatus of FIG. 1a, thereby indicating a possible nuisance load.

In a second illustrative example, the micro-controller 112 again measures multiple voltages across the integrating capacitor C3 during a specified number of consecutive time periods. FIG. 10*a* illustrates six such voltages occurring during six consecutive time periods. Specifically, a first voltage occurs during the time period $t_1$ to $t_3$, a second voltage occurs during the time period $t_3$ to $t_5$, a third voltage occurs during the time period $t_5$ to $t_7$, a fourth voltage occurs during the time period $t_7$ to $t_9$, a fifth voltage occurs during the time period $t_9$ to $t_{11}$, and a sixth voltage occurs during the time period $t_{11}$ to $t_{13}$. In this second example, the integrating capacitor C3 is reset at about times $t_2$, $t_4$, $t_6$, $t_8$, $t_{10}$, and $t_{12}$ during the first, second, third, fourth, fifth, and sixth time periods, respectively. Next, the micro-controller 112 determines the number of consecutive time periods during which the voltage levels take on successively lower or decreasing values. As shown in FIG. 10*a*, in this second illustrative example, all six voltages corresponding to the six consecutive time periods take on successively lower or decreasing values. In the event the number of consecutive time periods for which the measured voltage levels have decreasing values is greater than or equal to a predetermined threshold, tripping of the electromechanical interface 117 may be inhibited. Accordingly, in this second example, if the predetermined threshold were equal to six, then the micro-controller 112 may inhibit the tripping of the electromechanical interface 117. In this case, the high frequency components of the AC line current may be deemed to have resulted from a nuisance load.

It is noted that the algorithm employed in this second illustrative example may be used in conjunction with the algorithm employed in the first illustrative example described above for further reducing the occurrence of nuisance tripping. For example, if (1) according to the first algorithm, the number of consecutive time periods for which the measured voltage levels exceeded the specified minimum value were greater than or equal to a predetermined threshold, and (2) according to the second algorithm, all of the voltages corresponding to the consecutive time periods take on successively lower values, then the micro-controller 112 may inhibit the tripping of the electromechanical interface 117 since such a condition may be indicative of a nuisance load. It is appreciated that a desired level of performance for reducing the occurrence of nuisance tripping can be achieved via a suitable selection of the specified number of consecutive time periods during which the measured voltage levels have decreasing values.

Figure 10B:
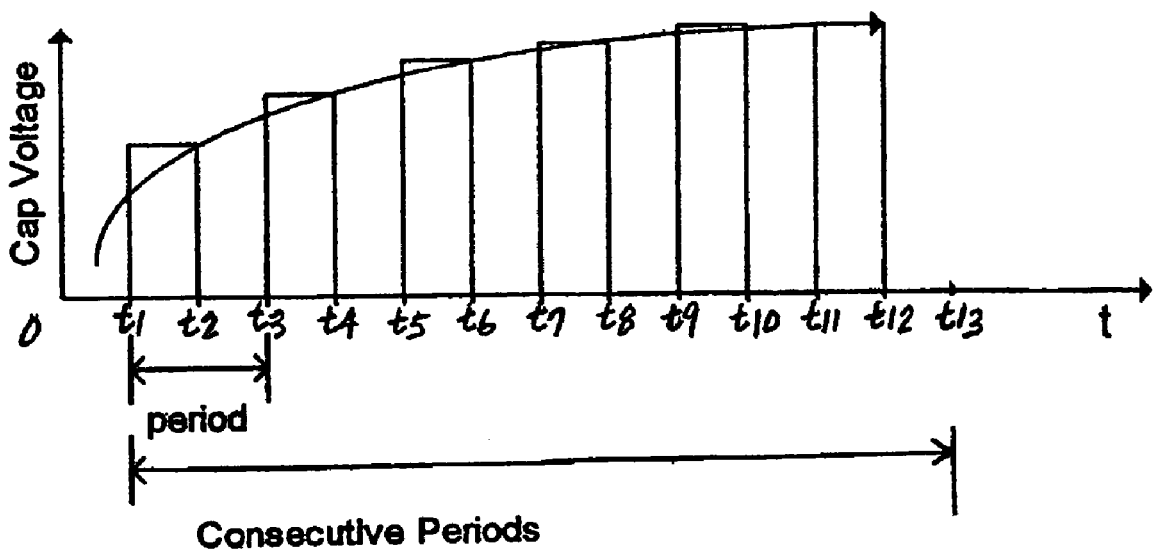
FIG. 10b is a diagram illustrating a number of consecutive periods of increasing voltage across the integrating capacitor included in the arc fault detection apparatus of FIG. 1a, thereby indicating a possible nuisance load.

In a third illustrative example, the micro-controller 112 again measures multiple voltages across the integrating capacitor C3 during a specified number of consecutive time periods. FIG. 10*b* illustrates six such voltages occurring during six consecutive time periods. Specifically, a first voltage occurs during the time period $t_1$ to $t_3$, a second voltage occurs during the time period $t_3$ to $t_5$, a third voltage occurs during the time period $t_5$ to $t_7$, a fourth voltage occurs during the time period $t_7$ to $t_9$, a fifth voltage occurs during the time period $t_9$ to $t_{11}$, and a sixth voltage occurs during the time period $t_{11}$ to $t_{13}$. In this third example, the integrating capacitor C3 is reset at about times $t_2$, $t_4$, $t_6$, $t_8$, $t_{10}$, and $t_{12}$ during the first, second, third, fourth, fifth, and sixth time periods, respectively. Next, the micro-controller 112 determines the number of consecutive time periods during which the voltage levels take on successively higher or increasing values. As shown in FIG. 10*b*, in this third illustrative example, all six voltages corresponding to the six consecutive time periods take on successively higher or increasing values. In the event the number of consecutive time periods for which the measured voltage levels have increasing values is greater than or equal to a predetermined threshold, tripping of the electromechanical interface 117 may be inhibited. Accordingly, in this third example, if the predetermined threshold were equal to six, then the micro-controller 112 may inhibit the tripping of the electromechanical interface 117. In this case, the high frequency components of the AC line current may be deemed to have resulted from a nuisance load.

It is noted that like the algorithm employed in the second illustrative example described above, the algorithm employed in this third example may be used in conjunction with the algorithm employed in the first example for further reducing the occurrence of nuisance tripping. For example, if (1) according to the first algorithm, the number of consecutive time periods for which the measured voltage levels exceeded the specified minimum value were greater than or equal to a predetermined threshold, and (2) according to the third algorithm, all of the voltages corresponding to the consecutive time periods take on successively higher values, then the micro-controller 112 may inhibit the tripping of the electromechanical interface 117 since such a condition may be indicative of a nuisance load. It is appreciated that a desired level of performance for reducing the occurrence of nuisance tripping can be achieved via a suitable selection of the specified number of consecutive time periods during which the measured voltage levels have increasing values. It should also be appreciated that the algorithm employed in this third example may be used in conjunction with the algorithm employed in the second example, in which case the microcontroller 112 would be operative to determine the number of consecutive time periods during which the voltage levels take on successively higher values, to determine the number of consecutive time periods during which the voltage levels take on successively lower values, and to take appropriate action (i.e., trip the electromechanical interface 117 or inhibit the tripping of the electromechanical interface 117) based upon whether the determined numbers of consecutive time periods exceed one or more predetermined thresholds.

Figure 11:
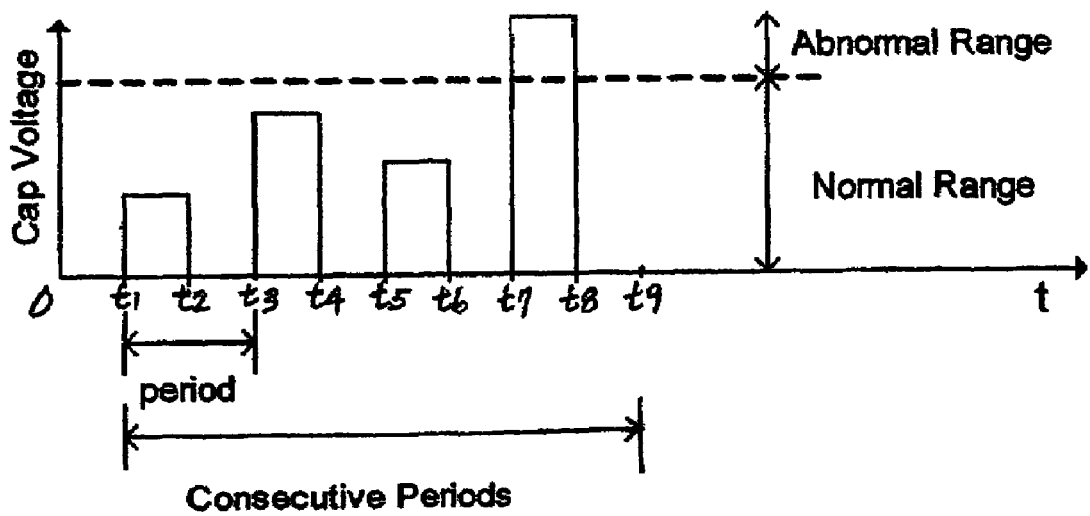
FIG. 11 is a diagram illustrating a single period of abnormally high voltage across the integrating capacitor included in the arc fault detection apparatus of FIG. 1a, thereby indicating a possible nuisance load.

In a fourth illustrative example, the micro-controller 112 again measures multiple voltages across the integrating capacitor C3 during a specified number of consecutive time periods. FIG. 11 illustrates four such voltages occurring during four consecutive time periods. Specifically, a first voltage occurs during the time period $t_1$ to $t_3$, a second voltage occurs during the time period $t_3$ to $t_5$, a third voltage occurs during the time period $t_5$ to $t_7$, and a fourth voltage occurs during the time period $t_7$ to $t_9$. In this fourth example, the integrating capacitor C3 is reset at about times $t_2$, $t_4$, $t_6$, and $t_8$ during the first, second, third, and fourth time periods, respectively. Next, the micro-controller 112 determines whether one or more of the voltage levels measured during the four consecutive time periods fall outside a predetermined normal range of values. As shown in FIG. 11, in this fourth illustrative example, one of the four voltage levels, specifically, the fourth voltage occurring during the time period $t_7$ to $t_9$, falls outside the predetermined normal range. In this case, the high frequency components of the AC line current are deemed to have resulted from, for example, high level or parallel arcing, line noise, a circuit malfunction, or a nuisance load. Even though the voltage level during the time period $t_7$ to $t_9$ is abnormally high, tripping of the electromechanical interface 117 may be inhibited since such a high voltage level can typically be controlled via a diode-corrected capacitor or bridge or any other suitable output limiting, bounding, or clipping circuit, or any suitable range checking technique. In one embodiment, the microcontroller 112 operates to trip the electromechanical interface 117 to disconnect the power output from the load upon detection of an abnormally high voltage level.

It is noted that like the algorithms employed in the second and third illustrative examples described above, the algorithm employed in this fourth example may be used in conjunction with the algorithm employed in the first example for further reducing the occurrence of nuisance tripping. For example, if a single abnormally high voltage level were detected during the four consecutive time periods, then the micro-controller 112 may or may not inhibit the tripping of the electromechanical interface 117, depending upon whether or not the algorithm employed in the first example detected an electrical arc fault during these four consecutive time periods. In addition, the algorithm employed in this fourth example may be used in conjunction with the algorithms employed in the second and third examples described above. It is appreciated that a desired level of performance for reducing the occurrence of nuisance tripping can be achieved via a suitable selection of the specified number of consecutive time periods during which the measured voltages are monitored for abnormally high levels.

Figure 12:
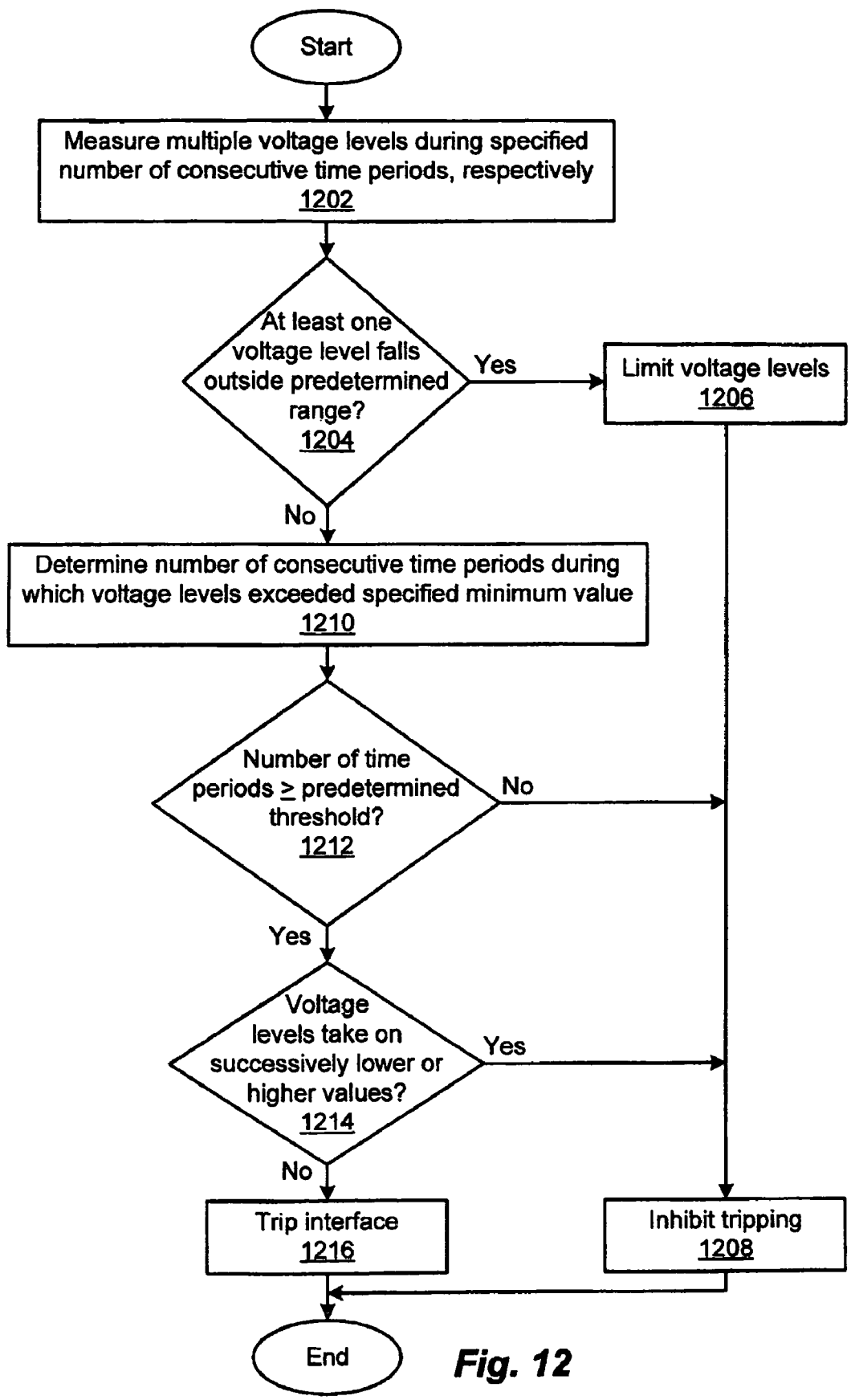
FIG. 12 is a flow diagram illustrating a method of operating the arc fault detection apparatus of FIG. 1a, in which electrical arc faults can be detected or nuisance tripping can be inhibited by monitoring the voltage across the integrating capacitor included in the apparatus during a number of consecutive time periods.

An illustrative method of operating the arc fault detection apparatus 100 that incorporates the algorithms employed in the foregoing illustrative examples is described below with reference to FIGS. 1b and 12. As depicted in step 1202, the processing unit 112 measures multiple voltage levels provided by the arcing sense circuit 104 during a specified number of consecutive time periods, respectively. It is noted that in this illustrative method of operation, the voltage levels provided by the arcing sense circuit 104 are indicative of at least one electrical arcing event. Next, a determination is made by the processing unit 112 as to whether at least one of the voltage levels provided by the arcing sense circuit 104 falls outside a predetermined range of values, as depicted in step 1204. In the event at least one of the voltage levels provided by the arcing sense circuit 104 falls outside the predetermined range of values, the voltage levels are limited to fall within the predetermined range by any suitable output limiting circuit or range checking technique, as depicted in step 1206. In addition, tripping of the electromechanical interface 117 is inhibited, as depicted in step 1208. The processing unit 112 then determines the number of consecutive time periods during which the voltage levels provided by the arcing sense circuit 104 exceeded a specified minimum value, as depicted in step 1210. Next, a determination is made by the processing unit 112 as to whether the number of consecutive time periods for which the voltage levels exceeded the specified minimum value is greater than or equal to a predetermined threshold value, as depicted in step 1212. In the event the number of consecutive time periods for which the voltage levels exceeded the specified minimum value is less than the predetermined threshold, tripping of the electromechanical interface 117 is inhibited, as depicted in step 1208. Next, a determination is made by the processing unit 112 as to whether the voltage levels provided by the arcing sense circuit 104 take on successively lower or higher values during the specified number of consecutive time periods, as depicted in step 1214. In the event the voltage levels take on successively lower or higher values during the specified number of consecutive time periods, tripping of the electromechanical interface 117 is inhibited, as depicted in step 1208. In this case, the electrical arcing event can be designated as an arc fault. Otherwise, the processing unit 112 activates the firing circuit 108 to trip the electromechanical interface 117, as depicted in step 1216, thereby interrupting the power output to the load. In this case, the electrical arcing event can be designated as a nuisance condition.

It is noted that the presently disclosed arc fault detection apparatus and method may be employed in any suitable digital, analog, or mixed signal environment for detecting and distinguishing between electrical arc faults and nuisance conditions. For example, the presently disclosed apparatus and method may be employed in an arc fault circuit breaker (AFCB) or a more integral system within a commercial or military aircraft for interrupting power to one or more protected circuits, and/or for providing higher level communications regarding the aircraft system status and maintenance. The presently disclosed arc fault detection apparatus and method may also be employed in any other suitable residential, commercial, industrial, or military application for detecting and distinguishing between electrical arc faults and nuisance conditions with increase reliability.

It will be appreciated by those of ordinary skill in the art that further modifications to and variations of the above-described methods of detecting arc faults characterized by consecutive periods of arcing may be made without departing from the inventive concepts disclosed herein. Accordingly, the invention should not be viewed as limited except as by the scope and spirit of the appended claims.

What is claimed is:

1. A method of detecting arc faults, comprising the steps of:
   sensing at least one signal associated with a power input, the sensed signal being indicative of at least one electrical arcing event;
   generating a plurality of accumulated signals corresponding to the at least one sensed signal, each of the plurality of accumulated signals being generated over a respective time period;
   measuring at least one level associated with each of the plurality of accumulated signals generated over the respective time periods;
   determining a first number of consecutive time periods during which the levels associated with the accumulated signals exceed a specified minimum value;
   in the event the first number of consecutive time periods exceeds a first predetermined threshold value, designating the at least one electrical arcing event as an arc fault; and
   otherwise, designating the at least one electrical arcing event as a nuisance condition.

2. The method of claim 1 wherein the power input is associated with a power output coupleable to a load, and further including the step of, in the event the at least one electrical arcing event is designated as an arc fault, disconnecting the power output from the load.

3. The method of claim 1 wherein the power input is associated with a power output coupleable to a load, and further including the step of, in the event the at least one electrical arcing event is designated as a nuisance condition, maintaining a connection from the power output to the load.

4. The method of claim 1 wherein the measuring step includes the step of measuring a single level of a respective accumulated signal during each consecutive time period.

5. The method of claim 1 wherein the measuring step includes the step of measuring multiple levels of a respective accumulated signal during each consecutive time period.

6. The method of claim 1 wherein the generating step includes the step of generating each of the plurality of accumulated signals over a half cycle of a line voltage.

7. The method of claim 1 wherein the generating step includes the step of generating each of the plurality of accumulated signals over a predetermined constant time period.

8. The method of claim 1 wherein the generating step includes the step of generating each of the plurality of accumulated signals over a predetermined variable time period.

9. The method of claim 1 further including the step of determining a second number of consecutive time periods during which the levels associated with the accumulated signals have one of (i) successively lower values and (ii) successively higher values.

10. The method of claim 9 wherein the power input is associated with a power output coupleable to a load, and further including the steps of:
    in the event the second number of consecutive time periods exceeds a second predetermined threshold value, maintaining a connection from the power output to the load; and
    otherwise, disconnecting the power output from the load.

11. The method of claim 10 wherein the first predetermined threshold value is equal to the second predetermined threshold value.

12. The method of claim 1 further including the steps of determining a second number of consecutive time periods during which the levels associated with the accumulated signals have successively lower values, and determining a third number of consecutive time periods during which the levels associated with the accumulated signals have successively higher values.

13. The method of claim 12 wherein the power input is associated with a power output coupleable to a load, and further including the steps of:
    in the event the second and third numbers of consecutive time periods exceed second and third predetermined threshold values, respectively, maintaining a connection from the power output to the load; and
    otherwise, disconnecting the power output from the load.

14. The method of claim 13 wherein the first predetermined threshold value is equal to at least one of the second and third predetermined threshold values.

15. The method of claim 13 wherein the second predetermined threshold value is equal to the third predetermined threshold value.

16. The method of claim 1 wherein the specified minimum value falls within a predetermined range of values, and further including the step of determining whether at least one of the levels measured in the measuring step falls outside the predetermined range of values.

17. The method of claim 16 further including the step of, in the event at least one of the levels measured in the measuring step falls outside the predetermined range of values, limiting the levels of the accumulated signals to fall within the predetermined range of values.

18. The method of claim 16 wherein the power input is associated with a power output coupleable to a load, and further including the step of:
    in the event the at least one electrical arcing event is designated as a nuisance condition and at least one of the levels measured in the measuring step falls outside the predetermined range of values, maintaining a connection from the power output to the load.

19. The method of claim 16 wherein the power input is associated with a power output coupleable to a load, and further including the step of:
    in the event at least one of the levels measured in the measuring step falls outside the predetermined range of values, disconnecting the power output from the load.

20. A method of detecting arc faults, comprising the steps of:
    sensing at least one signal associated with a power input, the sensed signal being indicative of at least one electrical arcing event, the power input being associated with a power output coupleable to a load;
    generating a plurality of accumulated signals corresponding to the at least one sensed signal, each of the plurality of accumulated signals being generated over a respective time period;
    measuring at least one level associated with each of the plurality of accumulated signals generated over the respective time periods;
    determining whether the levels associated with the accumulated signals are characteristic of an electrical arc fault;
    in the event the levels associated with the accumulated signals are characteristic of an electrical arc fault, determining at least one number of consecutive time periods during which the levels associated with the accumulated signals have at least one of (i) successively lower values and (ii) successively higher values;

in the event the at least one number of consecutive time periods exceeds at least one predetermined threshold value, maintaining a connection from the power output to the load; and otherwise, disconnecting the power output from the load.

21. A system for detecting arc faults, comprising:

an input sense circuit configured to sense at least one signal associated with a power input, the sensed signal being indicative of at least one electrical arcing event;

an accumulating circuit configured to generate a plurality of accumulated signals corresponding to the at least one sensed signal, each of the plurality of accumulated signals being generated over a respective time period; and a processing unit operative to:

measure at least one level associated with each of the plurality of accumulated signals generated over the respective time periods;

determine a first number of consecutive time periods during which the levels associated with the accumulated signals exceed a specified minimum value;

in the event the first number of consecutive time periods exceeds a first predetermined threshold value, designate the at least one electrical arcing event as an arc fault; and otherwise, designate the at least one electrical arcing event as a nuisance condition.

22. The system of claim 21 further including a power output coupleable to a load, and an electromechanical interface coupled between the power input and the power output, and wherein the processing unit is further operative, in the event the at least one electrical arcing event is designated as an arc fault, to trip the electromechanical interface, thereby disconnecting the power output from the load.

23. The system of claim 21 further including a power output coupleable to a load, and an electromechanical interface coupled between the power input and the power output, and wherein the processing unit is further operative, in the event the at least one electrical arcing event is designated as a nuisance condition, to inhibit tripping of the electromechanical interface, thereby maintaining a connection from the power output to the load.

24. The system of claim 21 wherein the processing unit is further operative to determine a second number of consecutive time periods during which the levels associated with the accumulated signals have one of (i) successively lower values and (ii) successively higher values.

25. The system of claim 24 wherein the first predetermined threshold value is equal to the second predetermined threshold value.

26. The system of claim 24 further including a power output coupleable to a load, and an electromechanical interface coupled between the power input and the power output, and wherein the processing unit is further operative:

in the event the second number of consecutive time periods exceeds a second predetermined threshold value, to inhibit tripping of the electromechanical interface, thereby maintaining a connection from the power output to the load; and otherwise, to trip the electromechanical interface, thereby disconnecting the power output from the load.

27. The system of claim 21 wherein the processing unit is further operative to determine a second number of consecutive time periods during which the levels associated with the accumulated signals have successively lower values, and to determine a third number of consecutive time periods during which the levels associated with the accumulated signals have successively higher values.

28. The system of claim 27 further including a power output coupleable to a load, and an electromechanical interface coupled between the power input and the power output, and wherein the processing unit is further operative:

in the event the second and third numbers of consecutive time periods exceed second and third predetermined threshold values, respectively, to inhibit tripping of the electromechanical interface, thereby maintaining a connection from the power output to the load; and otherwise, to trip the electromechanical interface, thereby disconnecting the power output from the load.

29. The system of claim 28 wherein the first predetermined threshold value is equal to at least one of the second and third predetermined threshold values.

30. The system of claim 28 wherein the second predetermined threshold value is equal to the third predetermined threshold value.

31. The system of claim 21 wherein the specified minimum value falls within a predetermined range of values, and wherein the processing unit is further operative to determine whether at least one of the measured levels falls outside the predetermined range of values.

32. The system of claim 31 further including a power output coupleable to a load, and an electromechanical interface coupled between the power input and the power output, and wherein the processing unit is further operative:

in the event the at least one electrical arcing event is designated as a nuisance condition and at least one of the measured levels falls outside the predetermined range of values, to inhibit tripping of the electromechanical interface, thereby maintaining a connection from the power output to the load.

33. The system of claim 31 further including a power output coupleable to a load, and an electromechanical interface coupled between the power input and the power output, and wherein the processing unit is further operative:

in the event at least one of the measured levels falls outside the predetermined range of values, to trip of the electromechanical interface, thereby disconnecting the power output from the load.

34. A system for detecting arc faults, comprising:

a power input;

a power output coupleable to a load;

an input sense circuit configured to sense at least one signal associated with the power input, the sensed signal being indicative of at least one electrical arcing event;

an accumulating circuit configured to generate a plurality of accumulated signals corresponding to the at least one sensed signal, each of the plurality of accumulated signals being generated over a respective time period;

an electromechanical interface coupled between the power input and the power output; and a processing unit operative to:

measure at least one level associated with each of the plurality of accumulated signals generated over the respective time periods;

determine whether the levels associated with the accumulated signals are characteristic of an electrical arc fault;

in the event the levels associated with the accumulated signals are characteristic of an electrical arc fault, determine at least one number of consecutive time periods during which the levels associated with the accumulated signals have at least one of (i) successively lower values and (ii) successively higher values;

in the event the at least one number of consecutive time periods exceeds at least one predetermined threshold value, inhibit tripping of the electromechanical interface, thereby maintaining a connection from the power output to the load; and otherwise, trip the electromechanical interface, thereby disconnecting the power output from the load.

* * * * *